(12) United States Patent
Bae et al.

(10) Patent No.: US 9,711,729 B2
(45) Date of Patent: Jul. 18, 2017

(54) ORGANIC ELECTRONIC ELEMENT COMPRISING FULLERENE DERIVATIVE

(71) Applicant: LG CHEM, LTD., Seoul (KR)

(72) Inventors: Jaesoon Bae, Daejeon (KR); Doo Whan Choi, Daejeon (KR); Jaechol Lee, Daejeon (KR); Jiyoung Lee, Daejeon (KR); Jeong Min Choi, Daejeon (KR); Hangken Lee, Daejeon (KR); Jinseck Kim, Daejeon (KR); Songrim Jang, Daejeon (KR); Keun Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 8 days.

(21) Appl. No.: 14/888,897

(22) PCT Filed: Apr. 28, 2014

(86) PCT No.: PCT/KR2014/003706
§ 371 (c)(1),
(2) Date: Nov. 3, 2015

(87) PCT Pub. No.: WO2014/181986
PCT Pub. Date: Nov. 13, 2014

(65) Prior Publication Data
US 2016/0087213 A1    Mar. 24, 2016

(30) Foreign Application Priority Data
May 7, 2013 (KR) .................. 10-2013-0051540

(51) Int. Cl.
*H01L 51/00* (2006.01)
*C09K 11/06* (2006.01)
(Continued)

(52) U.S. Cl.
CPC .......... *H01L 51/0047* (2013.01); *C09K 11/06* (2013.01); *C09K 2211/1416* (2013.01);
(Continued)

(58) Field of Classification Search
None
See application file for complete search history.

(56) References Cited

U.S. PATENT DOCUMENTS

2004/0214218 A1    10/2004 Nakamura et al.
2007/0278482 A1    12/2007 Cho et al.
(Continued)

FOREIGN PATENT DOCUMENTS

KR    1020080109288 A    12/2008
KR    1020100062579 A    6/2010
(Continued)

OTHER PUBLICATIONS

Masatomi Ohno, et al., "An efficient functionalization of [60] fullerene. Diels-Alder reaction using 1,3-butadienes substituted with electron-withdrawing and electron-donating (silyloxy) groups", Tetrahedron, vol. 52. No. 14. pp. 4983-4994, 1996.
(Continued)

*Primary Examiner* — Catherine S Branch
(74) *Attorney, Agent, or Firm* — Dentons US LLP

(57) ABSTRACT

The present specification relates to an organic electronic device including a fullerene derivative.

17 Claims, 6 Drawing Sheets

(51) Int. Cl.
*H01L 51/42* (2006.01)
*H01L 51/05* (2006.01)
*H01L 51/50* (2006.01)

(52) U.S. Cl.
CPC ............ *C09K 2211/1458* (2013.01); *C09K 2211/1483* (2013.01); *C09K 2211/1491* (2013.01); *H01L 51/0034* (2013.01); *H01L 51/0037* (2013.01); *H01L 51/0512* (2013.01); *H01L 51/424* (2013.01); *H01L 51/4253* (2013.01); *H01L 51/50* (2013.01); *H01L 2251/308* (2013.01); *Y02E 10/549* (2013.01)

(56) References Cited

U.S. PATENT DOCUMENTS

| 2010/0065829 A1* | 3/2010 | Forrest ............ B82Y 10/00 257/40 |
| 2012/0004476 A1 | 1/2012 | Yoon et al. |
| 2012/0097235 A1 | 4/2012 | He et al. |
| 2012/0097249 A1 | 4/2012 | Klenkler et al. |
| 2013/0144083 A1 | 6/2013 | Dong et al. |

FOREIGN PATENT DOCUMENTS

| KR | 10-2013-0027284 A | 3/2013 |
| TW | 200805644 A | 1/2008 |
| WO | 2012005762 A1 | 1/2012 |

OTHER PUBLICATIONS

Youjun He, et al., High performance low band gap polymer solar cells with a non-conventional acceptor, Chem. Commun, 2012, 48, 7616-7618.

Jae Kwan Lee, et al., "New approach for forming bulk-heterojunction solar cells comprising a -conjugated polymer C60", Organic Electronics, 10, 2009, 1223-1227.

W. Tang, "Two-layer organic photovoltaic cell C.", Appl. Phys. Lett., 48, 183.(1996).

G. Yu, et al., "Polymer Photovoltaic Cells: Enhanced Efficiencies via a Network of Internal Donor-Acceptor Heterojunctions", Science, 270, 1789. (1995).

Sakthivel Pachagounder et al: "Synthesis and studies of methyl ester substituted thieno-o-quinodimethane fullerene multiadducts for polymer solar cells", Solar Energy Materials and Solar Cells, Elsevier Science Publishers, Amsterdam, NL, vol. 113, Feb. 28, 2013 (Feb. 28, 2013), pp. 13-19.

Youjun He et al: "Indene-C60 Bisadduct: A New Acceptor for High-Performance Polymer Solar Cells", Journal of the American Chemical Society, vol. 132, No. 4, Jan. 7, 2010 (Jan. 7, 2010), pp. 1377-1382.

Steven K. Hau et al: "Interfacial modification to improve inverted polymer solar cells", Journal of Materials Chemistry, vol. 18, No. 42, Oct. 1, 2008 (Oct. 1, 2008), p. 5113-5119.

* cited by examiner

[FIG. 1]
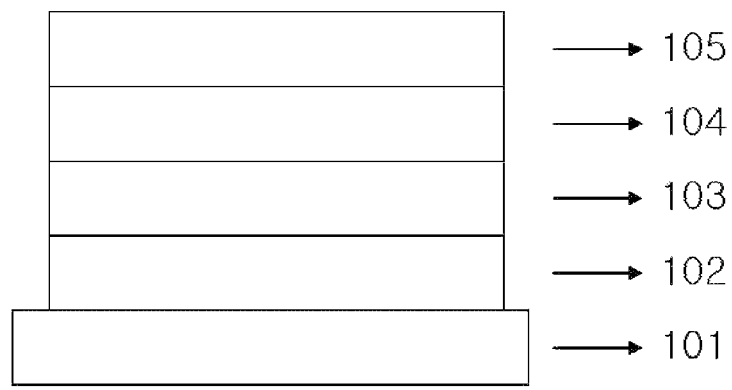
[FIG. 2]
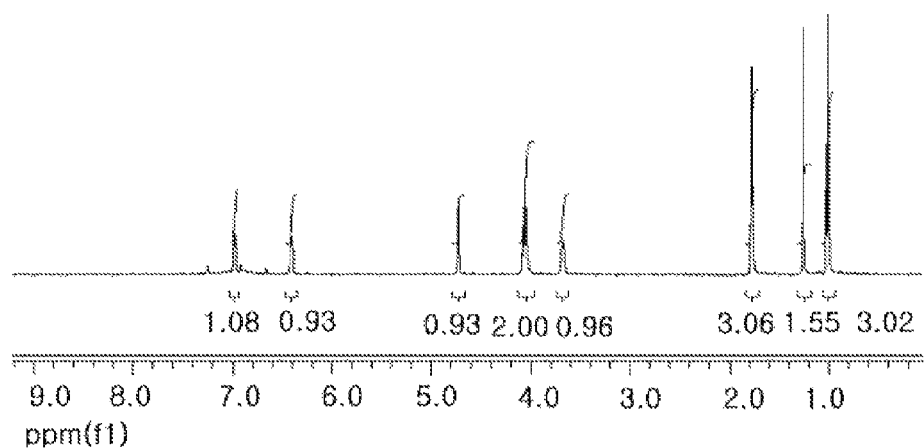

【FIG. 3】
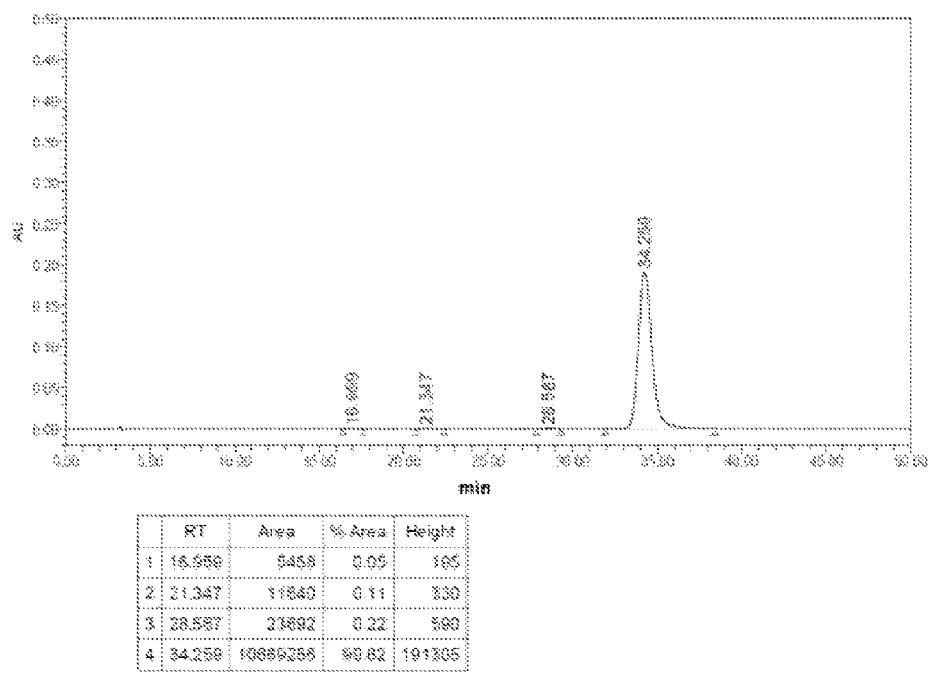

[FIG. 4]
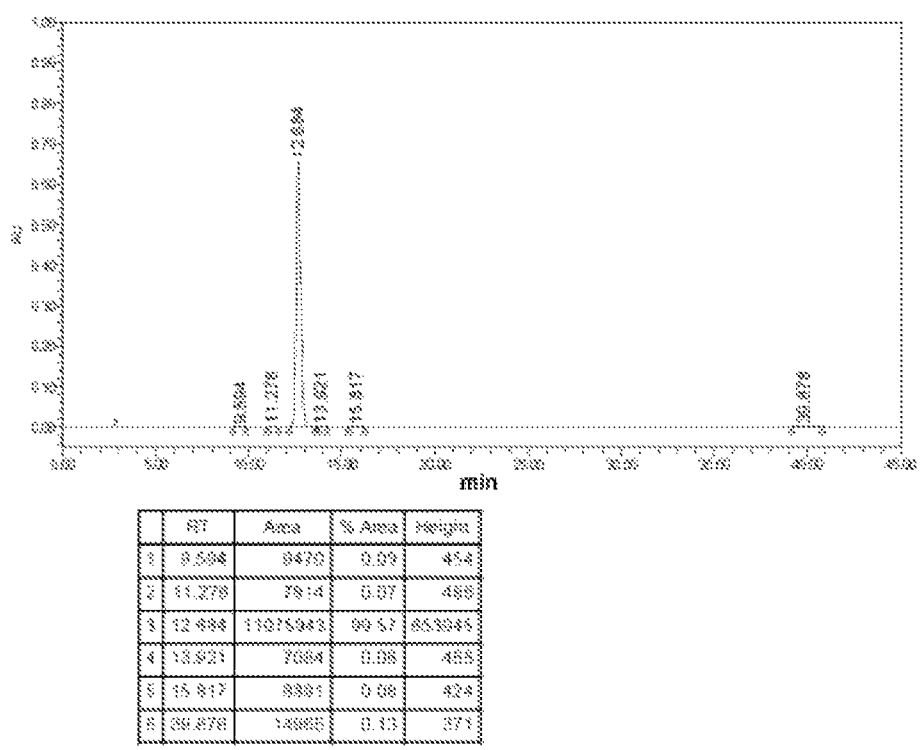

[FIG. 5]
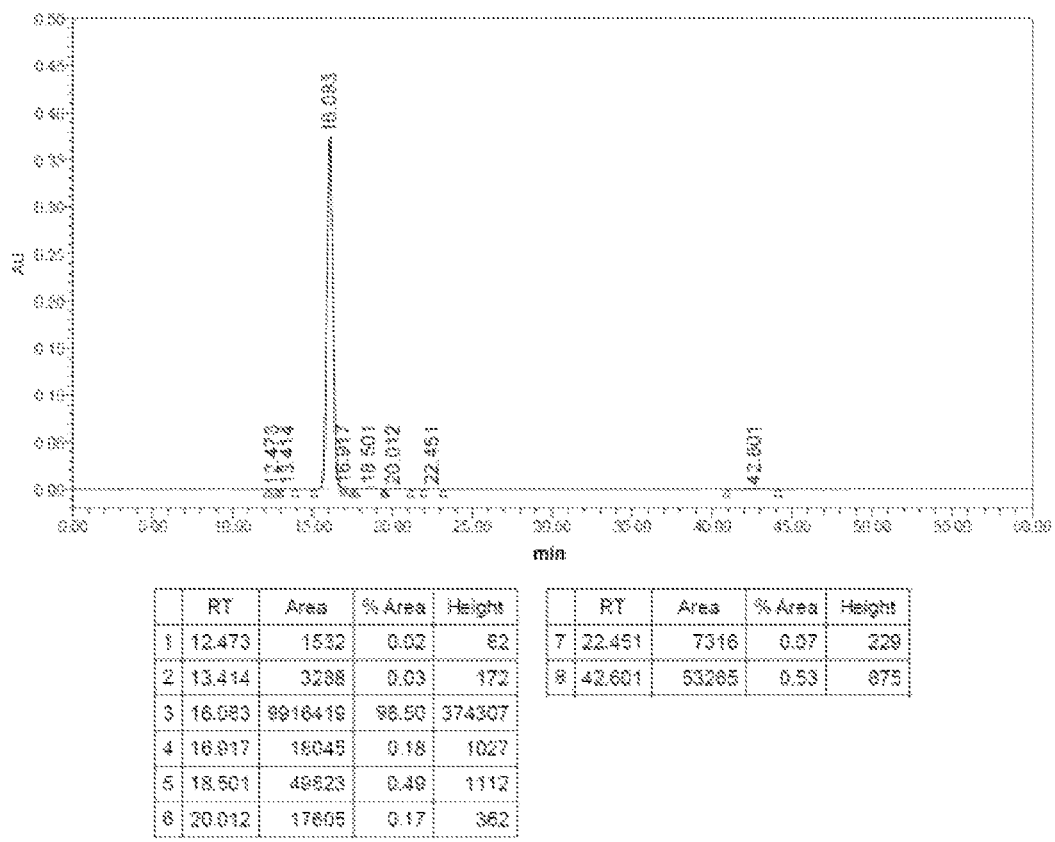

[FIG. 6]
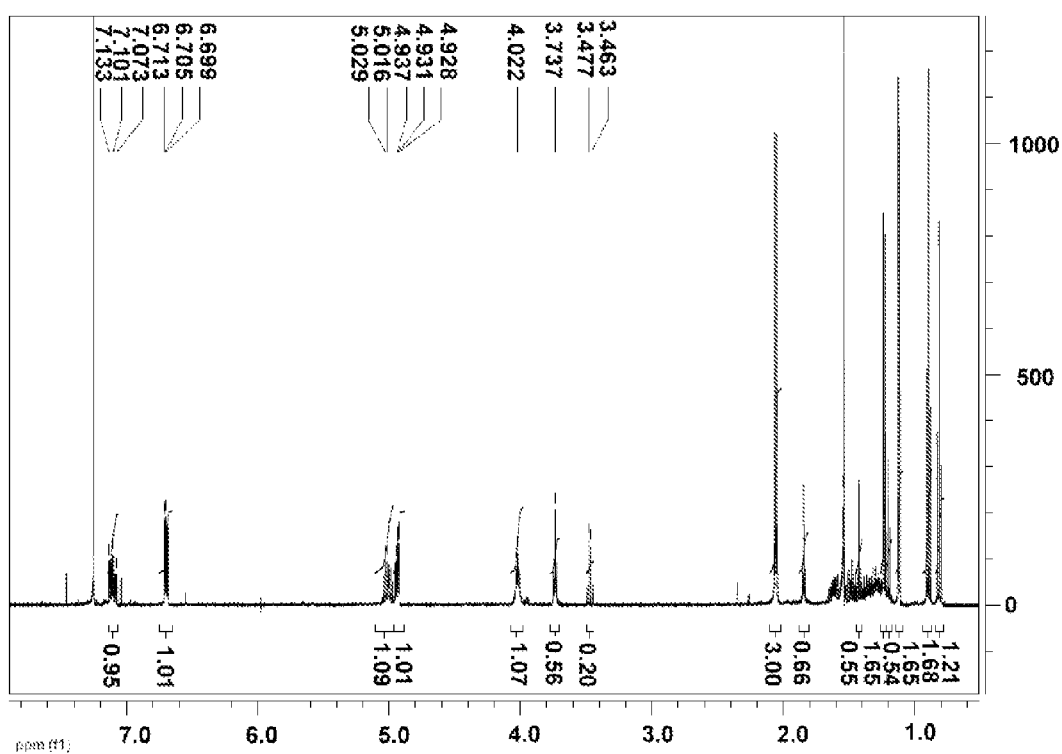

[FIG. 7]
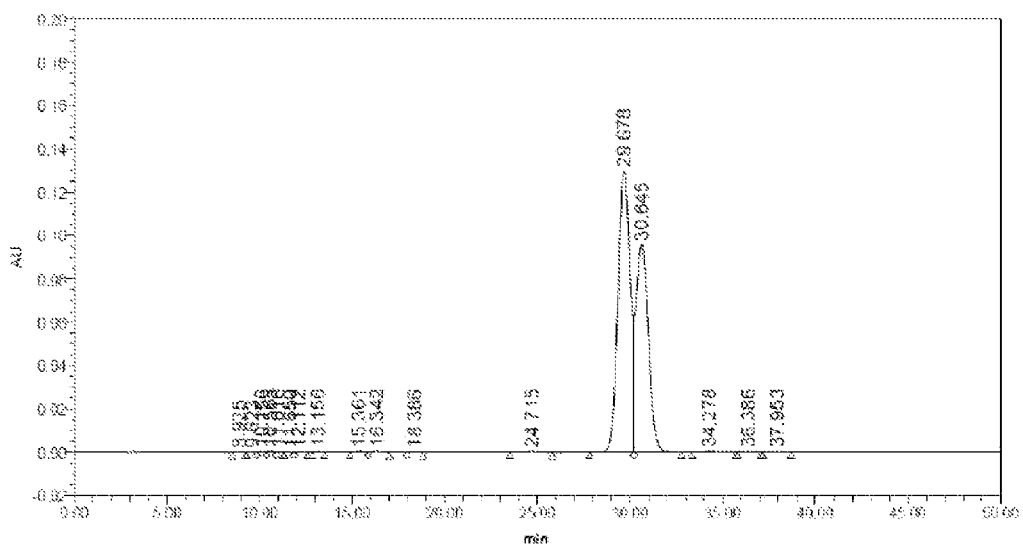

ORGANIC ELECTRONIC ELEMENT COMPRISING FULLERENE DERIVATIVE

TECHNICAL FIELD

The present specification relates to a fullerene derivative and an organic electronic device including the same.

This application is a National Stage Application of International Application No. PCT/KR2014/003706, filed Apr. 28, 2014, and claims priority to and the benefits of Korean Patent Application No. 10-2013-0051540, filed with the Korean Intellectual Property Office on May 7, 2013, the entire contents of which are incorporated herein by reference.

BACKGROUND ART

An organic electronic device means a device that needs charge exchanges between an electrode and an organic material using holes and/or electrons. An organic electronic device can be categorized into two main groups depending on the operation principle. First is an electric device in which excitons form in an organic material layer by the photons brought into the device from an external light source, these excitons are separated into electrons and holes, and these electrons and holes are used as a current source (voltage source) by each being transferred to different electrodes. Second is an electronic device in which holes and/or electrons are injected to an organic material semiconductor that forms an interface with an electrode by applying voltage or current to two or more electrodes, and the device is operated by the injected electrons and holes.

Examples of an organic electronic device include an organic light emitting device, an organic solar cell, an organic transistor, and the like, and these all need a hole injection or transfer material, an electron injection or transfer material, or a light emitting material for the driving of the device. Hereinafter, an organic solar cell will be described in detail, however, in the organic electronic devices described above, the hole injection or transfer material, the electron injection or transfer material, or the light emitting material is used under similar principles.

The possibility of an organic solar cell was first presented in 1970s, but the organic solar cell had no practical use since the efficiency was too low.

However, since C. W. Tang of Eastman Kodak showed the possibility of commercialization as various solar cells with a bilayer structure using copper phthalocyanine (CuPc) and perylene tetracarboxylic acid derivatives in 1986, interests in organic solar cells and related researches have rapidly increased brining in a lot of progresses.

Since then, organic solar cells have made innovative progresses in terms of efficiency as the concept of a bulk heterojunction (BHJ) was introduced by Yu et al. in 1995, and fullerene derivatives of which solubility is improved such as PCBM have been developed as an n-type semiconductor material.

However, problems such that fullerene, a starting material, is expensive, difficult to synthesize and does not have favorable solubility, are still blocking the development of electron acceptor materials.

Meanwhile, the development of electron donor materials having a low band gap and electron acceptor materials having favorable charge mobility has been continuously attempted in order to replace existing materials.

PRIOR ART DOCUMENTS

Non-Patent Documents

Two-layer organic photovoltaic cell (C. W. Tang, Appl. Phys. Lett., 48, 183. (1996))

Efficiencies via Network of Internal Donor-Acceptor Heterojunctions (G. Yu, J. Gao, J. C. Hummelen, F. Wudl, A. J. Heeger, Science, 270, 1789. (1995))

DISCLOSURE

Technical Problem

An objective of the present invention is to provide an organic electronic device including a fullerene derivative.

Technical Solution

One embodiment of the present specification provides an organic electronic device including a first electrode; a second electrode provided opposite to the first electrode; and one or more organic material layers provided between the first electrode and the second electrode, wherein one or more layers of the organic material layers include a fullerene derivative represented by the following Chemical Formula 1.

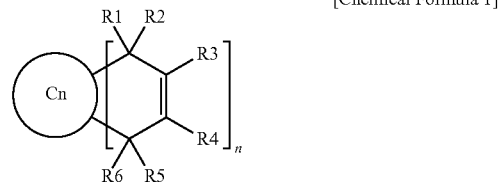

[Chemical Formula 1]

In Chemical Formula 1, n is an integer of 1 to 5, when n is 2 or greater, the structures within the parenthesis are the same as or different from each other, Cn is fullerene of $C_{60}$ to $C_{120}$, and R1 to R6 are the same as or different from each other, each independently hydrogen; a halogen group; a nitro group; a cyano group; a carboxyl group; a hydroxyl group; a substituted or unsubstituted carbonyl group; a sulfo group ($-SO_3H$); a substituted or unsubstituted alkyl group; a substituted or unsubstituted alkoxy group; a substituted or unsubstituted cycloalkyl group; a substituted or unsubstituted alkenyl group; a substituted or unsubstituted ester group; a substituted or unsubstituted thioester group; a substituted or unsubstituted amide group; a substituted or unsubstituted ether group; a substituted or unsubstituted sulfonyl group; a substituted or unsubstituted alkylthioxy group; a substituted or unsubstituted arylthioxy group; a substituted or unsubstituted alkylamine group; a substituted or unsubstituted arylamine group; a substituted or unsubstituted arylalkyl group; a substituted or unsubstituted heteroarylalkyl group; a substituted or unsubstituted aryl group; or a substituted or unsubstituted heteroring group including one or more of N, O and S atoms, or adjacent substituents bond to each other to form a substituted or unsubstituted hydrocarbon ring; or a substituted or unsubstituted heteroring including one or more of N, O and S atoms.

Advantageous Effects

An organic electronic device including a fullerene derivative according to one embodiment of the present specification shows efficiency enhancement and/or safety enhancement.

A fullerene derivative according to one embodiment of the present specification can be used either alone or as a mixture with impurities in an organic electronic device including an organic solar cell, and a vacuum deposition method, a solution coating method or the like may be applied.

An organic electronic device including a fullerene derivative according to one embodiment of the present specification has excellent photoefficiency and thermal stability, and has improved life span characteristics.

DESCRIPTION OF DRAWINGS

FIG. 1 is a diagram showing an organic solar cell according to one embodiment of the present specification.

FIG. 2 is $^1$H-NMR (in $C_6D_4Cl_2$) of a compound of n=1 in the structure of Chemical Formula 1-1-10 according to one embodiment of the present specification.

FIG. 3 is a diagram showing liquid chromatography (HPLC) of a compound of n=1 in the structure of Chemical Formula 1-1-10 according to one embodiment of the present specification.

FIG. 4 is a diagram showing liquid chromatography (HPLC) in the structure of Chemical Formula 1-1-8 according to one embodiment of the present specification.

FIG. 5 is a diagram showing liquid chromatography (HPLC) in the structure of Chemical Formula 1-1-9 according to one embodiment of the present specification.

FIG. 6 is a diagram showing an NMR graph in the structure of Chemical Formula 1-1-11 according to one embodiment of the present specification.

FIG. 7 is a diagram showing liquid chromatography (HPLC) in the structure of Chemical Formula 1-1-11 according to one embodiment of the present specification.

MODE FOR DISCLOSURE

Hereinafter, the present specification will be described in detail.

One embodiment of the present specification provides an organic electronic device including a fullerene derivative represented by Chemical Formula 1.

In one embodiment of the present specification, at least one of R1 to R6 is a substituted or unsubstituted ester group.

At least one of R1 to R6 being an ester group is effective in the increase of solubility and/or in having excellent storage stability. Consequently, in the manufacture of organic electronic devices, there are economic effects in time and/or costs.

In one embodiment of the present specification, the fullerene derivative represented by Chemical Formula 1 provides an organic electronic device including a fullerene derivative represented by the following Chemical Formula 2.

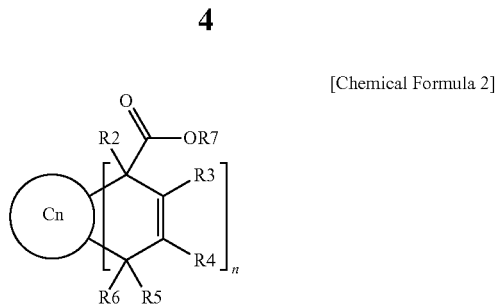

[Chemical Formula 2]

In Chemical Formula 2,

Cn, n and R2 to R6 are the same as those defined in Chemical Formula 1,

R7 is hydrogen; a substituted or unsubstituted carbonyl group; a substituted or unsubstituted alkyl group; a substituted or unsubstituted arylalkyl group; a substituted or unsubstituted heteroarylalkyl group; a substituted or unsubstituted cycloalkyl group; a substituted or unsubstituted alkenyl group; a substituted or unsubstituted aryl group; or a substituted or unsubstituted heteroring group including one or more of N, O and S atoms.

In one embodiment of the present specification, the fullerene derivative represented by Chemical Formula 1 provides an organic electronic device including a fullerene derivative represented by the following Chemical Formula 3.

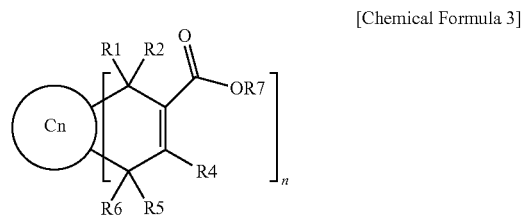

[Chemical Formula 3]

In Chemical Formula 3,

Cn, n, R1, R2, and R4 to R6 are the same as those defined in Chemical Formula 1, R7 is hydrogen; a substituted or unsubstituted carbonyl group; a substituted or unsubstituted alkyl group; a substituted or unsubstituted arylalkyl group; a substituted or unsubstituted heteroarylalkyl group; a substituted or unsubstituted cycloalkyl group; a substituted or unsubstituted alkenyl group; a substituted or unsubstituted aryl group; or a substituted or unsubstituted heteroring group including one or more of N, O and S atoms.

Examples of the substituents are described below, however, the substituents are not limited thereto.

The term "substitution" means a hydrogen atom bonding to a carbon atom of a compound is changed to other substituent, and the position of substitution is not limited as long as it is a position at which a hydrogen atom is substituted, that is, a position at which a substituent can substitute, and when two or more substituents substitute, the two or more substituents may be the same as or different from each other.

In the present specification, the term "substituted or unsubstituted" means being substituted with one or more substituents selected from the group consisting of a halogen group; a nitro group; a cyano group; a carboxyl group; a hydroxyl group; a carbonyl group; a sulfo group; an alkyl group; an allyl group; an alkoxy group; a cycloalkyl group; an alkenyl group; an ester group; an ether group; a sulfonyl group; an arylalkyl group; a heteroarylalkyl group; an aryl group; or a heterocyclic group including one or more of N, O and S atoms, or having no substituents.

In the present specification, the halogen group may include fluorine, chlorine, bromine or iodine.

In the present specification, the carbonyl group may be represented by

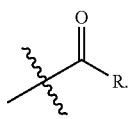

Herein, R is hydrogen; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a substituted or unsubstituted aryl group having 6 to 60 carbon atoms; or a substituted or unsubstituted heteroring group having 2 to 60 carbon atoms, which includes one or more of N, O and S atoms.

In the present specification, the sulfonyl group may be represented by $-SO_2R'$. Herein, R' is a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a substituted or unsubstituted aryl group having 6 to 60 carbon atoms; or a substituted or unsubstituted heteroring group having 2 to 60 carbon atoms, which includes one or more of N, O and S atoms.

In the present specification, the alkyl group may be linear or branched, and the number of carbon atoms, although not particularly limited, is preferably 1 to 60. In one embodiment, the number of carbon atoms is 1 to 24. Specific examples thereof include a methyl group, an ethyl group, a propyl group, an isopropyl group, a butyl group, a t-butyl group, a pentyl group, a hexyl group, a decyl group, a dodecyl group, an icosanyl group, a heptyl group and the like, but are not limited thereto.

In the present specification, the cycloalkyl group is not particularly limited, but preferably has 3 to 60 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, a norbonyl group, an adamantly group and the like, but are not limited thereto.

In the present specification, the alkoxy group may be linear, branched or cyclic. The number of carbon atoms in the alkoxy group is not particularly limited, but is preferably 1 to 60. In one embodiment, the number of carbon atoms is 1 to 24. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, 2-ethylhexyloxy, 2-methylheptyloxy, 2-propylbutyloxy, n-nonyloxy, n-decyloxy, benzyloxy, p-methylbenzyloxy and the like, but are not limited thereto.

In the present specification, the number of carbon atoms in the arylalkyl group is not particularly limited, however, in one embodiment of the present specification, the number of carbon atoms in the arylalkyl group is 7 to 50. Specifically, the aryl part has 6 to 49 carbon atoms, and the alkyl part has 1 to 44 carbon atoms. Specific examples thereof include a benzyl group, a p-methylbenzyl group, an m-methylbenzyl group, a p-ethylbenzyl group, an m-ethylbenzyl group, a 3,5-dimethylbenzyl group, an α-methylbenzyl group, an α,α-dimethylbenzyl group, an α,α-methylphenylbenzyl group, a 1-naphthylbenzyl group, a 2-naphthylbenzyl group, a p-fluorobenzyl group, a 3,5-difluorobenzyl group, an α,α-ditrifluoromethylbenzyl group, a p-methoxybenzyl group, an m-methoxybenzyl group, an α-phenoxybenzyl group, an α-benzyloxybenzyl group, a naphthylmethyl group, a naphthylethyl group, a naphthylisopropyl group, a pyrrolylmethyl group, a pyrrolylethyl group, an aminobenzyl group, a nitrobenzyl group, a cyanobenzyl group, a 1-hydroxy-2-phenylisopropyl group, a 1-chloro-2-phenylisopropyl group and the like, but are not limited thereto.

In the present specification, the alkenyl group may be linear or branched, and although not particularly limited, the number of carbon atoms is preferably 2 to 40. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the general formula of the thioester group may be represented by

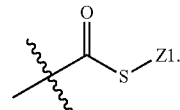

Herein, Z1 is hydrogen; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a substituted or unsubstituted aryl group having 6 to 60 carbon atoms; or a substituted or unsubstituted heteroring group having 2 to 60 carbon atoms, which includes one or more of N, O and S atoms.

The general formula of the amide group of the present specification may be represented by

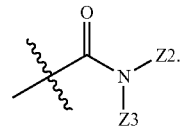

Herein, Z2 and Z3 are the same as or different from each other, and each independently hydrogen; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a substituted or unsubstituted aryl group having 6 to 60 carbon atoms; or a substituted or unsubstituted heteroring group having 2 to 60 carbon atoms, which includes one or more of N, O and S atoms.

In the present specification, the aryl group may be a monocyclic aryl group or a multicyclic aryl group, and include a case in which an alkyl group having 1 to 25 carbon atoms or an alkoxy group having 1 to 25 carbon atoms is substituted. In addition, the aryl group in the present specification may mean an aromatic ring.

When the aryl group is a monocyclic aryl group, the number of carbon atoms is not particularly limited, however, the number of carbon atoms is preferably 6 to 25. Specific examples of the monocyclic aryl group include a phenyl group, a biphenyl group, a terphenyl group and the like, but are not limited thereto.

When the aryl group is a multicyclic aryl group, the number of carbon atoms is not particularly limited, however, the number of carbon atoms is preferably 10 to 24. Specific examples of the multicyclic aryl group include a naphthyl group, an anthracenyl group, a phenanthrenyl group, a pyrenyl group, a perylenyl group, a tetracenyl group, a crycenyl group, a fluorenyl group, an acenaphthacenyl group, a triphenylene group, a fluoranthene group and the like, but the examples are not limited thereto.

In the present specification, the heteroring group is a heteroring group including one or more of O, N and S as a heteroatom, and, although not particularly limited, the number of carbon atoms is preferably 2 to 60. Examples of the heteroring group include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyrido-pyrimidinyl group, a pyrido-pyrazinyl group, a pyrazino-pyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group and the like, but are not limited thereto.

In the present specification, the alkyl group in the alkylthioxy group and the alkylamine group is the same as the examples of the alkyl group described above.

In the present specification, the aryl group in the arylthioxy group and the arylamine group is the same as the examples of the aryl group described above.

In the present specification, the general formula of the ester group may be represented by

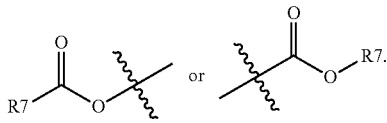

Herein, R7 is hydrogen; an alkoxy group having 1 to 60 carbon atoms; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a heteroarylalkyl group having 2 to 60 carbon atoms; a substituted or unsubstituted ester group having 1 to 40 carbon atoms; a substituted or unsubstituted carbonyl group having 1 to 40 carbon atoms; a substituted or unsubstituted aryl group having 6 to 60 carbon atoms; or a substituted or unsubstituted heteroring group having 2 to 60 carbon atoms, which includes one or more of N, O and S atoms.

In one embodiment of the present specification, R1 to R6 are the same as or different from each other, and each independently hydrogen; a nitro group; a cyano group; a carboxyl group; a substituted or unsubstituted carbonyl group; a sulfo group; a substituted or unsubstituted alkyl group; a substituted or unsubstituted alkoxy group; a substituted or unsubstituted ester group; a substituted or unsubstituted sulfonyl group; a substituted or unsubstituted arylalkyl group, or adjacent substituents bond to each other to form a substituted or unsubstituted hydrocarbon ring; or a substituted or unsubstituted heteroring including one or more of N, O and S atoms.

In one embodiment, at least one of R1 to R6 is a nitro group; a cyano group; a carboxyl group; a substituted or unsubstituted carbonyl group; a sulfo group; a substituted or unsubstituted alkyl group; a substituted or unsubstituted alkoxy group; a substituted or unsubstituted ester group; a substituted or unsubstituted sulfonyl group; a substituted or unsubstituted arylalkyl group, or adjacent substituents bond to each other to form a substituted or unsubstituted hydrocarbon ring; or a substituted or unsubstituted heteroring including one or more of N, O and S atoms.

In one embodiment of the present specification, at least one of R1 to R6 is an carboxyl group; or an ester group unsubstituted or substituted with an alkyl group unsubstituted or substituted with substituents selected from the group consisting of a halogen group, a carboxyl group, an alkoxy group, a cyano group, an ester group, a hydroxyl group, a carbonyl group, an alkenyl group, polyethylene glycol, an aryl group, a crown ether group, and a heteroring group including one or more of N, O and S atoms.

In one embodiment of the present specification, at least one of R1 to R6 is

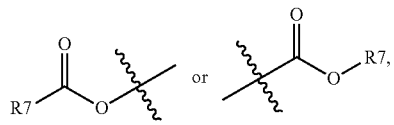

and R7 is hydrogen; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a substituted or unsubstituted heteroarylalkyl group having 2 to 60 carbon atoms; a substituted or unsubstituted carbonyl group having 1 to 40 carbon atoms; a substituted or unsubstituted aryl group having 6 to 60 carbon atoms; or a substituted or unsubstituted heteroring group having 2 to 60 carbon atoms, which includes one or more of N, O and S atoms.

In one embodiment of the present specification, R7 is hydrogen; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a heteroarylalkyl group having 2 to 60 carbon atoms; or a substituted or unsubstituted aryl group having 6 to 60 carbon atoms.

In one embodiment of the present specification, R7 is an alkyl group unsubstituted or substituted with substituents selected from the group consisting of a halogen group, a carboxyl group, an alkoxy group, a cyano group, an ester group, a hydroxyl group, a carbonyl group, an alkenyl group, polyethylene glycol, an aryl group, a crown ether group, and a heteroring group including one or more of N, O and S atoms. The alkoxy group, the carbonyl group, the alkenyl group, the polyethylene glycol, the aryl group, the crown ether group and the heteroring group including one or more of N, O and S atoms substituting the alkyl group may be substituted with additional substituents.

In one embodiment of the present specification, R7 is an aryl group unsubstituted or substituted with substituents selected from the group consisting of an alkyl group, a cyano group, a carbonyl group and an aldehyde group. The alkyl group and the carbonyl group substituting the aryl group may be substituted with additional substituents.

In one embodiment of the present specification, R7 is hydrogen.

In the present specification,

means a site that bonds to other substituents or bonding sites.

Adjacent substituents in the present specification mean substituents that substitute neighboring carbons such as R1 or R2 and R3; R3 and R4; R4 and R5 or R6; and R1 or R2 and R5 or R6.

Adjacent groups bonding to each other to form a hydrocarbon ring or a heteroring in the present specification mean adjacent substituents forming a bond to form a 5-membered to 7-membered monocyclic or multicyclic hydrocarbon ring, or a 5-membered to 7-membered monocyclic or multicyclic heteroring including one or more of N, O, and S as a heteroatom.

The hydrocarbon ring in the present specification includes all of a cycloalkyl group; a cycloalkenyl group; an aromatic ring group; or an aliphatic ring group, may be monocyclic or multicyclic, and includes a fused ring in which one, two or more of these are bonded.

The heteroring formed in the present specification means that at least one carbon atom in the hydrocarbon ring is substituted with an N, O, or S atom, and the formed heteroring may be an aliphatic ring or an aromatic ring, and may be monocyclic or multicyclic.

Specific examples thereof in the present specification include a fused cyclopropane ring, a fused cyclopropene ring, a fused cyclobutane ring, a fused cyclobutene ring, a fused cyclopentane ring, a fused cyclopentene ring, a fused cyclopentadiene ring, a fused cyclohexane ring, a fused cyclohexene ring, a fused cyclohexadiene ring, a fused norbornane ring, a fused bicyclo[2,2,2]octene ring and the like, but are not limited thereto.

In one embodiment of the present specification, R7 is hydrogen; a carboxyl group; a cyano group; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a heteroarylalkyl group having 2 to 60 carbon atoms; a substituted or unsubstituted ester group having 1 to 40 carbon atoms; a substituted or unsubstituted carbonyl group having 1 to 40 carbon atoms; a substituted or unsubstituted aryl group having 6 to 60 carbon atoms; or a substituted or unsubstituted heteroring group having 2 to 60 carbon atoms, which includes one or more of N, O and S atoms.

In one embodiment of the present specification, R7 is hydrogen.

In one embodiment of the present specification, R7 is a substituted or unsubstituted alkyl group.

In one embodiment of the present specification, R7 is a methyl group.

In one embodiment of the present specification, R7 is an ethyl group.

In one embodiment of the present specification, R7 is a butyl group.

In one embodiment of the present specification, R7 is a heptyl group.

In one embodiment of the present specification, R7 is a nonadecane group.

In one embodiment of the present specification, R7 is a 1-methylheptyl group.

In other embodiment, R7 is a 1-methylbutyl group.

In another embodiment, R7 is a 2-ethylhexyl group.

In other embodiment, R7 is an alkyl group substituted with a substituted or unsubstituted heteroring group.

In one embodiment, R7 is an alkyl group substituted with a substituted or unsubstituted heteroring group including an S atom.

In another embodiment, R7 is an alkyl group substituted with a substituted or unsubstituted thiophene group.

In one embodiment, R7 is an alkyl group substituted with a substituted thiophene group.

In another embodiment, R7 is an ethyl group substituted with a phenyl-thiophene group.

In one embodiment of the present specification, R7 is an alkyl group substituted with a heteroring group.

In one embodiment of the present specification, R7 is an alkyl group substituted with a furan group.

In one embodiment of the present specification, R7 is an alkyl group substituted with a tetrahydrofuran group.

In one embodiment of the present specification, R7 is a tetraoxacyclododecane group.

In one embodiment of the present specification, R7 is a crown ether group.

In one embodiment of the present specification, R7 is an alkyl group substituted with a crown ether group.

In one embodiment of the present specification, R7 is an alkyl group substituted with an aryl group.

In one embodiment of the present specification, R7 is an alkyl group substituted with a phenyl group.

In one embodiment of the present specification, R7 is an alkyl group substituted with an alkoxy group.

In one embodiment of the present specification, R7 is an alkyl group substituted with a carboxyl group.

In one embodiment of the present specification, R7 is an alkyl group substituted with a cyano group.

In one embodiment of the present specification, R7 is an alkyl group substituted with an ester group.

In one embodiment of the present specification, R7 is an alkyl group substituted with a hydroxyl group.

In one embodiment of the present specification, R7 is an alkyl group substituted with an alkoxy group substituted with an alkoxy group.

In one embodiment of the present specification, R7 is an alkyl group substituted with a methoxy group.

In one embodiment of the present specification, R7 is an alkyl group substituted with an ethoxy group.

In one embodiment of the present specification, R7 is an alkyl group substituted with a carbonyl group.

In one embodiment of the present specification, R7 is an alkyl group substituted with a halogen group.

In one embodiment of the present specification, R7 is a pentafluoropropyl group.

In one embodiment of the present specification, R7 is a heptadecafluorononyl group.

In one embodiment of the present specification, R7 is a pentafluorododecanyl group.

In one embodiment of the present specification, R7 is an alkyl group substituted with fluorine.

In one embodiment of the present specification, R7 is an alkyl group substituted with an alkenyl group.

In one embodiment of the present specification, R7 is a substituted or unsubstituted cycloalkyl group.

In one embodiment of the present specification, R7 is a cyclohexyl group.

In one embodiment of the present specification, R7 is a substituted or unsubstituted aryl group.

In one embodiment of the present specification, R7 is a phenyl group.

In one embodiment of the present specification, R7 is a phenyl group substituted with an alkyl group.

In one embodiment of the present specification, R7 is a phenyl group substituted with a cyano group.

In one embodiment of the present specification, R7 is a phenyl group substituted with an aldehyde group.

In one embodiment of the present specification, R7 is a phenyl group substituted with a carbonyl group.

In one embodiment of the present specification, R7 is a phenyl group substituted with a carbonyl group substituted with an alkyl group.

In one embodiment of the present specification, R7 is a substituted or unsubstituted arylalkyl group.

In one embodiment of the present specification, R7 is a benzyl group.

In one embodiment of the present specification, R7 is a substituted or unsubstituted carbonyl group.

In one embodiment of the present specification, R7 is a carbonyl group substituted with a methyl group.

In one embodiment of the present specification, R1 is hydrogen.

In one embodiment of the present specification, R1 is a nitro group.

In one embodiment of the present specification, R1 is a substituted or unsubstituted alkyl group.

In one embodiment of the present specification, R1 is a methyl group.

In one embodiment of the present specification, R1 is a pentyl group.

In one embodiment of the present specification, R1 is a hexyl group.

In one embodiment of the present specification, R1 is a carboxyl group.

In one embodiment of the present specification, R1 is a substituted or unsubstituted ester group.

In one embodiment of the present specification, R1 is an ester group substituted with an alkyl group.

In one embodiment of the present specification, R1 is an ester group substituted with a methyl group.

In one embodiment of the present specification, R1 is an ester group substituted with an ethyl group.

In one embodiment of the present specification, R1 is an ester group substituted with a heptyl group.

In one embodiment of the present specification, R1 is an ester group substituted with a butyl group.

In one embodiment of the present specification, R1 is an ester group substituted with a nonadecane group.

In one embodiment of the present specification, R1 is an ester group substituted with a 1-methylheptyl group.

In one embodiment of the present specification, R1 is an ester group substituted with a 1-methylbutyl group.

In one embodiment of the present specification, R1 is an ester group substituted with a 2-ethylhexyl group.

In one embodiment of the present specification, R1 is an ester group substituted with a crown ether group.

In one embodiment of the present specification, R1 is an ester group substituted with an alkyl group substituted with a crown ether group.

In one embodiment of the present specification, R1 is an ester group substituted with a cycloalkyl group.

In one embodiment of the present specification, R1 is an ester group substituted with a cyclohexyl group.

In another embodiment, R1 is an ester group substituted with an alkyl group substituted with a substituted or unsubstituted heteroring group.

In one embodiment, R1 is an ester group substituted with an alkyl group substituted with a substituted or unsubstituted heteroring group including an S atom.

In another embodiment, R1 is an ester group substituted with an alkyl group substituted with a substituted or unsubstituted thiophene group.

In one embodiment, R1 is an ester group substituted with an alkyl group substituted with a thiophene group substituted with a phenyl group.

In another embodiment, R1 is an ester group substituted with an ethyl group substituted with a phenyl-thiophene group.

In one embodiment of the present specification, R1 is an ester group substituted with an alkyl group substituted with a heteroring group.

In one embodiment of the present specification, R1 is an ester group substituted with an alkyl group substituted with a furan group.

In one embodiment of the present specification, R1 is an ester group substituted with an alkyl group substituted with a tetrahydrofuran group.

In one embodiment of the present specification, R1 is an ester group substituted with a tetraoxacyclododecane group.

In one embodiment of the present specification, R1 is an ester group substituted with an alkyl group substituted with a substituted or unsubstituted aryl group.

In one embodiment of the present specification, R1 is an ester group substituted with an alkyl group substituted with a phenyl group.

In one embodiment of the present specification, R1 is an ester group substituted with an alkyl group substituted with a carboxyl group.

In one embodiment of the present specification, R1 is an ester group substituted with an alkyl group substituted with a substituted or unsubstituted alkoxy group.

In one embodiment of the present specification, R1 is an ester group substituted with an alkyl group substituted with a methoxy group.

In one embodiment of the present specification, R1 is an ester group substituted with an alkyl group substituted with an ethoxy group.

In one embodiment of the present specification, R1 is an ester group substituted with an alkyl group substituted with a cyano group.

In one embodiment of the present specification, R1 is an ester group substituted with an ester group.

In one embodiment of the present specification, R1 is an ester group substituted with an alkyl group substituted with a hydroxyl group.

In one embodiment of the present specification, R1 is an ester group substituted with an alkyl group substituted with a halogen group.

In one embodiment of the present specification, R1 is an ester group substituted with an alkyl group substituted with a fluoro group.

In one embodiment of the present specification, R1 is an ester group substituted with an alkyl group substituted with a trifluoroethyl group.

In one embodiment of the present specification, R1 is an ester group substituted with a pentafluoropropyl group.

In one embodiment of the present specification, R1 is an ester group substituted with a heptadecafluorononyl group.

In one embodiment of the present specification, R1 is an ester group substituted with a pentafluorododecanyl group.

In one embodiment of the present specification, R1 is an ester group substituted with an alkyl group substituted with an alkenyl group.

In one embodiment of the present specification, R1 is an ester group substituted with a substituted or unsubstituted arylalkyl group.

In one embodiment of the present specification, R1 is an ester group substituted with a benzyl group.

In one embodiment of the present specification, R1 is an ester group substituted with a substituted or unsubstituted aryl group.

In one embodiment of the present specification, R1 is an ester group substituted with a phenyl group.

In one embodiment of the present specification, R1 is an ester group substituted with a phenyl group substituted with an alkyl group.

In one embodiment of the present specification, R1 is an ester group substituted with a phenyl group substituted with a cyano group.

In one embodiment of the present specification, R1 is an ester group substituted with a phenyl group substituted with an aldehyde group.

In one embodiment of the present specification, R1 is an ester group substituted with a phenyl group substituted with a carbonyl group.

In one embodiment of the present specification, R1 is an ester group substituted with a phenyl group substituted with a carbonyl group substituted with an alkyl group.

In one embodiment of the present specification, R1 is an ester group substituted with a substituted or unsubstituted carbonyl group.

In one embodiment of the present specification, R1 is an ester group substituted with a carbonyl group substituted with a methyl group.

In one embodiment of the present specification, R1 is a substituted or unsubstituted alkoxy group.

In one embodiment of the present specification, R1 is an alkoxy group substituted with an alkyl group.

In one embodiment of the present specification, R1 is an alkoxy group substituted with an acetyl group.

In one embodiment of the present specification, R1 is a substituted or unsubstituted carbonyl group.

In one embodiment of the present specification, R1 is a carbonyl group substituted with an alkyl group.

In one embodiment of the present specification, R1 is a carbonyl group substituted with a methyl group.

In one embodiment of the present specification, R1 is a nitro group.

In one embodiment of the present specification, R1 is an ester group substituted with an alkyl group substituted with an alkoxy group substituted with an alkoxy group.

In one embodiment of the present specification, R2 is hydrogen.

In one embodiment of the present specification, R5 is hydrogen.

In one embodiment of the present specification, R6 is hydrogen.

In one embodiment of the present specification, R6 is a nitro group.

In one embodiment of the present specification, R6 is a substituted or unsubstituted alkyl group.

In one embodiment of the present specification, R6 is a methyl group.

In one embodiment of the present specification, R6 is a pentyl group.

In one embodiment of the present specification, R6 is a hexyl group.

In one embodiment of the present specification, R6 is a carboxyl group.

In one embodiment of the present specification, R6 is a substituted or unsubstituted ester group.

In one embodiment of the present specification, R6 is an ester group substituted with an alkyl group.

In one embodiment of the present specification, R6 is an ester group substituted with a methyl group.

In one embodiment of the present specification, R6 is an ester group substituted with an ethyl group.

In one embodiment of the present specification, R6 is an ester group substituted with a heptyl group.

In one embodiment of the present specification, R6 is an ester group substituted with a butyl group.

In one embodiment of the present specification, R6 is an ester group substituted with a nonadecane group.

In one embodiment of the present specification, R6 is an ester group substituted with a crown ether group.

In one embodiment of the present specification, R6 is an ester group substituted with an alkyl group substituted with a crown ether group.

In one embodiment of the present specification, R6 is an ester group substituted with a cycloalkyl group.

In one embodiment of the present specification, R6 is an ester group substituted with a cyclohexyl group.

In one embodiment of the present specification, R6 is an ester group substituted with an alkyl group substituted with a heteroring group.

In one embodiment of the present specification, R6 is an ester group substituted with an alkyl group substituted with a furan group.

In one embodiment of the present specification, R6 is an ester group substituted with an alkyl group substituted with a tetrahydrofuran group.

In one embodiment of the present specification, R6 is an ester group substituted with a tetraoxacyclododecane group.

In one embodiment of the present specification, R6 is an ester group substituted with an alkyl group substituted with a substituted or unsubstituted aryl group.

In one embodiment of the present specification, R6 is an ester group substituted with an alkyl group substituted with a phenyl group.

In one embodiment of the present specification, R6 is an ester group substituted with an alkyl group substituted with a carboxyl group.

In one embodiment of the present specification, R6 is an ester group substituted with an alkyl group substituted with a substituted or unsubstituted alkoxy group.

In one embodiment of the present specification, R6 is an ester group substituted with an alkyl group substituted with a methoxy group.

In one embodiment of the present specification, R6 is an ester group substituted with an alkyl group substituted with an ethoxy group.

In one embodiment of the present specification, R6 is an ester group substituted with an alkyl group substituted with a cyano group.

In one embodiment of the present specification, R6 is an ester group substituted with an ester group.

In one embodiment of the present specification, R6 is an ester group substituted with an alkyl group substituted with a hydroxyl group.

In one embodiment of the present specification, R6 is an ester group substituted with an alkyl group substituted with a halogen group.

In one embodiment of the present specification, R6 is an ester group substituted with an alkyl group substituted with a fluoro group.

In one embodiment of the present specification, R6 is an ester group substituted with an alkyl group substituted with a trifluoroethyl group.

In one embodiment of the present specification, R6 is an ester group substituted with a pentafluoropropyl group.

In one embodiment of the present specification, R6 is an ester group substituted with a heptadecafluorononyl group.

In one embodiment of the present specification, R6 is an ester group substituted with a pentafluorododecanyl group.

In one embodiment of the present specification, R6 is an ester group substituted with an alkyl group substituted with an alkenyl group.

In one embodiment of the present specification, R6 is an ester group substituted with a substituted or unsubstituted arylalkyl group.

In one embodiment of the present specification, R6 is an ester group substituted with a benzyl group.

In one embodiment of the present specification, R6 is an ester group substituted with a substituted or unsubstituted aryl group.

In one embodiment of the present specification, R6 is an ester group substituted with a phenyl group.

In one embodiment of the present specification, R6 is an ester group substituted with a phenyl group substituted with an alkyl group.

In one embodiment of the present specification, R6 is an ester group substituted with a phenyl group substituted with a cyano group.

In one embodiment of the present specification, R6 is an ester group substituted with a phenyl group substituted with an aldehyde group.

In one embodiment of the present specification, R6 is an ester group substituted with a phenyl group substituted with a carbonyl group.

In one embodiment of the present specification, R6 is an ester group substituted with a phenyl group substituted with a carbonyl group substituted with an alkyl group.

In one embodiment of the present specification, R6 is an ester group substituted with a substituted or unsubstituted carbonyl group.

In one embodiment of the present specification, R6 is an ester group substituted with a carbonyl group substituted with a methyl group.

In one embodiment of the present specification, R6 is a substituted or unsubstituted alkoxy group.

In one embodiment of the present specification, R6 is an alkoxy group substituted with an alkyl group.

In one embodiment of the present specification, R6 is an alkoxy group substituted with an acetyl group.

In one embodiment of the present specification, R6 is a substituted or unsubstituted carbonyl group.

In one embodiment of the present specification, R6 is a carbonyl group substituted with an alkyl group.

In one embodiment of the present specification, R6 is a carbonyl group substituted with a methyl group.

In one embodiment of the present specification, R6 is a nitro group.

In one embodiment of the present specification, R6 is an ester group substituted with an alkyl group substituted with an alkoxy group substituted with an alkoxy group.

In one embodiment of the present specification, the structure within the parenthesis in Chemical Formula 1 is represented by any one of the following chemical Formulae.

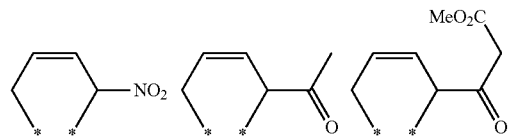

In one embodiment of the present specification, the structure within the parenthesis in Chemical Formula 1 is represented by any one of the following chemical Formulae.

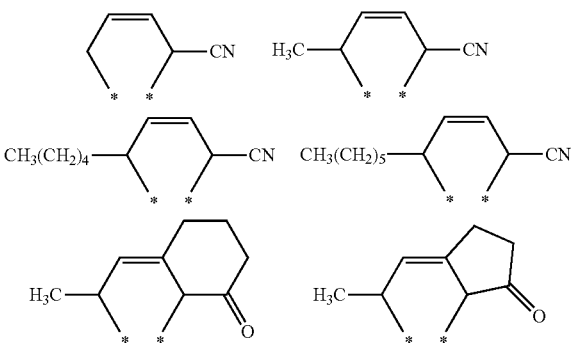

In one embodiment of the present specification, the structure within the parenthesis in Chemical Formula 1 is represented by any one of the following chemical Formulae.

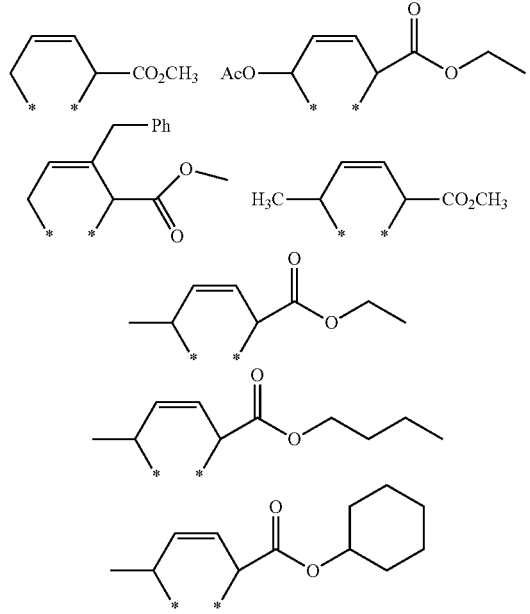

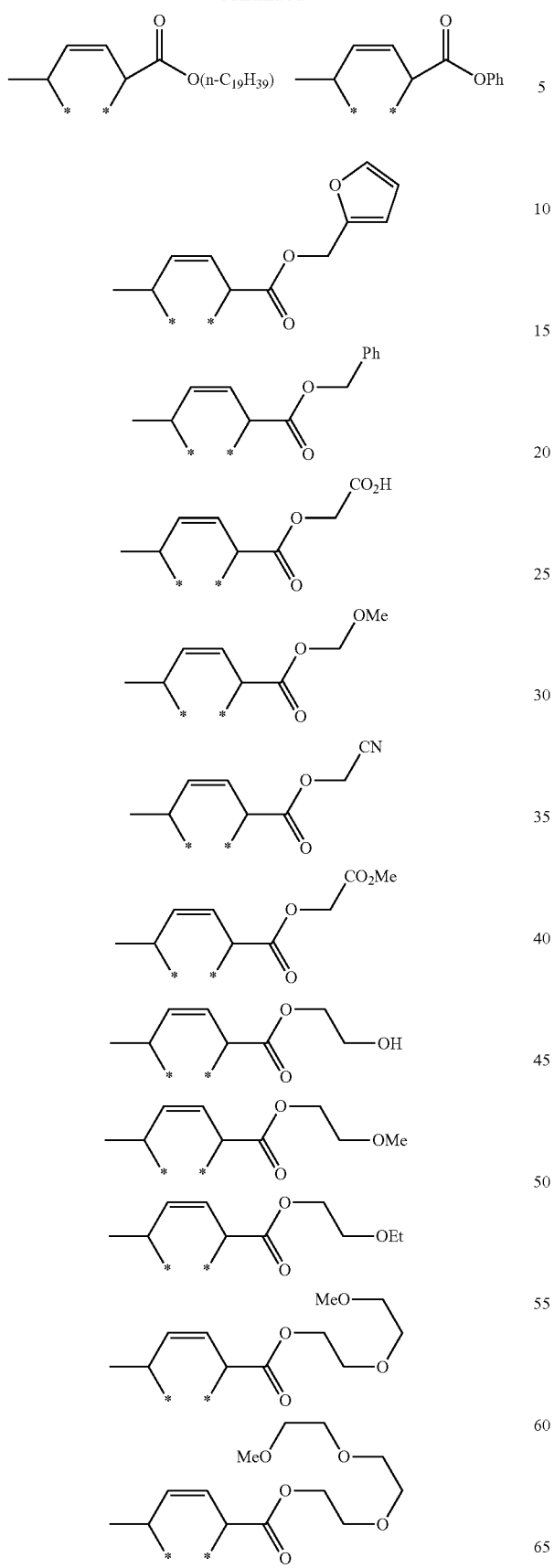
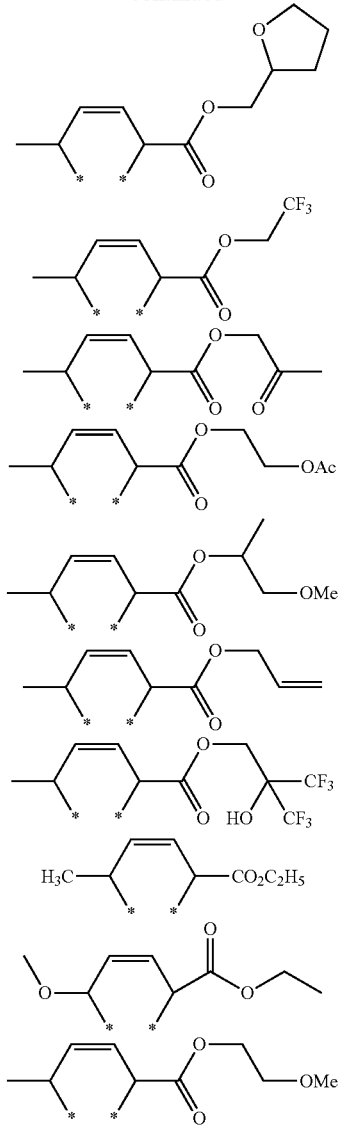
In one embodiment of the present specification, the structure within the parenthesis in Chemical Formula 1 is represented by any one of the following chemical Formulae.
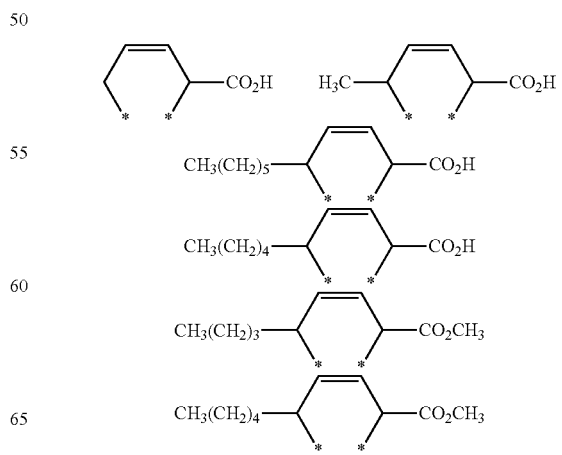

-continued

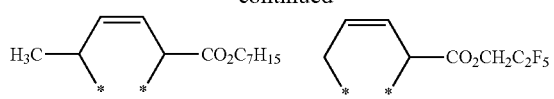
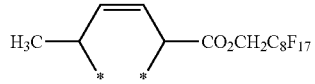
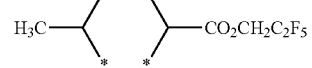
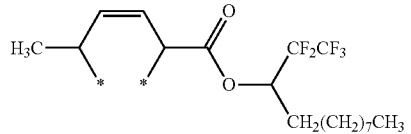
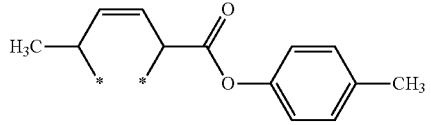
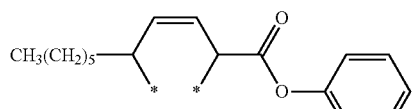
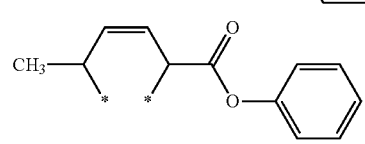
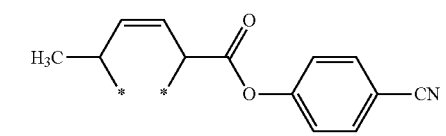
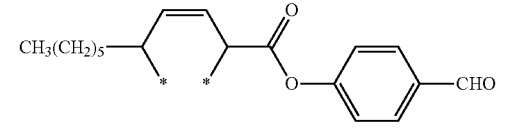
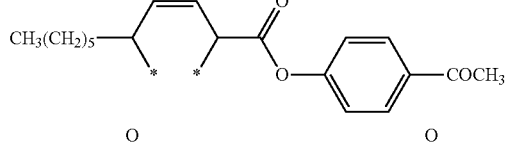
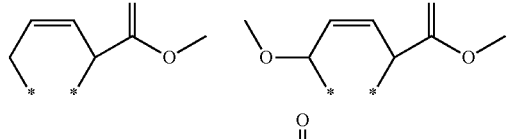
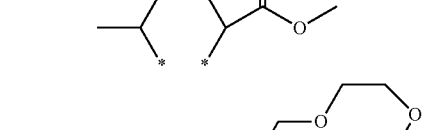
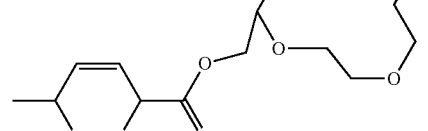

-continued

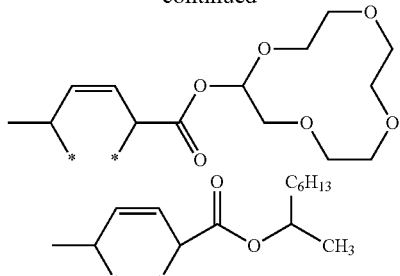
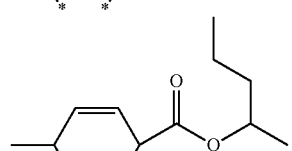
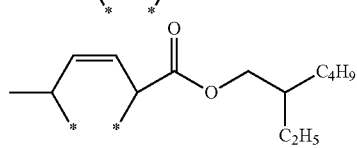
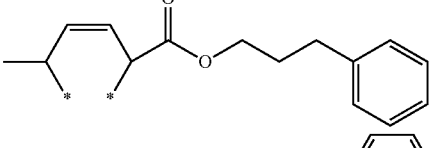
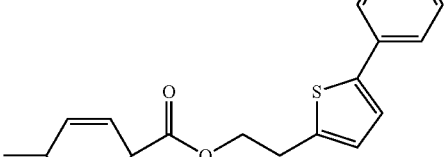
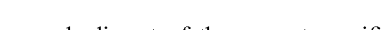

In one embodiment of the present specification, R3 is hydrogen.

In one embodiment of the present specification, R3 is a cyano group.

In one embodiment of the present specification, R3 is a carboxyl group.

In one embodiment of the present specification, R3 is a nitro group.

In one embodiment of the present specification, R3 is a sulfo group.

In one embodiment of the present specification, R3 is a substituted or unsubstituted carbonyl group.

In one embodiment of the present specification, R3 is a carbonyl group substituted with an alkyl group.

In one embodiment of the present specification, R3 is a carbonyl group substituted with an aryl group.

In one embodiment of the present specification, R3 is a carbonyl group substituted with a phenyl group.

In one embodiment of the present specification, R3 is a substituted or unsubstituted sulfonyl group.

In one embodiment of the present specification, R3 is a sulfonyl group substituted with an aryl group.

In one embodiment of the present specification, R3 is a sulfonyl group substituted with a phenyl group.

In one embodiment of the present specification, R3 is an alkoxy group substituted with an acetyl group.

In one embodiment of the present specification, R3 is an alkoxy group substituted with an alkyl group.

In one embodiment of the present specification, R3 is an alkoxy group substituted with a methyl group.

In one embodiment of the present specification, R3 is an alkoxy group substituted with an ethyl group.

In one embodiment of the present specification, R3 is a substituted or unsubstituted ester group.

In one embodiment of the present specification, R3 is an ester group substituted with an alkyl group.

In one embodiment of the present specification, R3 is an ester group substituted with a methyl group.

In one embodiment of the present specification, R3 is an ester group substituted with an ethyl group.

In one embodiment of the present specification, R3 is an ester group substituted with an aryl group.

In one embodiment of the present specification, R3 is an ester group substituted with a phenyl group.

In one embodiment of the present specification, R3 is a substituted or unsubstituted alkoxy group.

In one embodiment of the present specification, R3 is an alkoxy group substituted with an acetyl group.

In one embodiment of the present specification, R3 is a substituted or unsubstituted arylalkyl group.

In one embodiment of the present specification, R3 is a benzyl group.

In one embodiment of the present specification, R3 is a substituted or unsubstituted alkyl group.

In one embodiment of the present specification, R3 is an alkyl group substituted with a halogen group.

In one embodiment of the present specification, R3 is a trifluoroalkyl group.

In one embodiment of the present specification, R3 is an alkyl group.

In one embodiment of the present specification, R3 is a methyl group.

In one embodiment of the present specification, R3 is an alkyl group substituted with a hydroxyl group.

In one embodiment of the present specification, R3 is a methyl group substituted with a hydroxyl group.

In one embodiment of the present specification, R3 is an alkyl group substituted with a carboxyl group.

In one embodiment of the present specification, R3 is an alkyl group substituted with an ester group.

In one embodiment of the present specification, R3 is an alkyl group substituted with a phenyl group.

In one embodiment of the present specification, R3 is a methyl group substituted with a phenyl group.

In one embodiment of the present specification, R4 is hydrogen.

In one embodiment of the present specification, R4 is a cyano group.

In one embodiment of the present specification, R4 is a carboxyl group.

In one embodiment of the present specification, R4 is a nitro group.

In one embodiment of the present specification, R4 is a sulfo group.

In one embodiment of the present specification, R4 is a substituted or unsubstituted carbonyl group.

In one embodiment of the present specification, R4 is a carbonyl group substituted with an alkyl group.

In one embodiment of the present specification, R4 is a carbonyl group substituted with an aryl group.

In one embodiment of the present specification, R4 is a carbonyl group substituted with a phenyl group.

In one embodiment of the present specification, R4 is a substituted or unsubstituted sulfonyl group.

In one embodiment of the present specification, R4 is a sulfonyl group substituted with an aryl group.

In one embodiment of the present specification, R4 is a sulfonyl group substituted with a phenyl group.

In one embodiment of the present specification, R4 is an alkoxy group substituted with an acetyl group.

In one embodiment of the present specification, R4 is an alkoxy group substituted with an alkyl group.

In one embodiment of the present specification, R4 is an alkoxy group substituted with a methyl group.

In one embodiment of the present specification, R4 is an alkoxy group substituted with an ethyl group.

In one embodiment of the present specification, R4 is a substituted or unsubstituted ester group.

In one embodiment of the present specification, R4 is an ester group substituted with an alkyl group.

In one embodiment of the present specification, R4 is an ester group substituted with a methyl group.

In one embodiment of the present specification, R4 is an ester group substituted with an ethyl group.

In one embodiment of the present specification, R4 is an ester group substituted with an aryl group.

In one embodiment of the present specification, R4 is an ester group substituted with a phenyl group.

In one embodiment of the present specification, R4 is a substituted or unsubstituted alkoxy group.

In one embodiment of the present specification, R4 is an alkoxy group substituted with an acetyl group.

In one embodiment of the present specification, R4 is a substituted or unsubstituted arylalkyl group.

In one embodiment of the present specification, R4 is a benzyl group.

In one embodiment of the present specification, R4 is a substituted or unsubstituted alkyl group.

In one embodiment of the present specification, R4 is an alkyl group substituted with a halogen group.

In one embodiment of the present specification, R4 is a trifluoroalkyl group.

In one embodiment of the present specification, R4 is an alkyl group.

In one embodiment of the present specification, R4 is a methyl group.

In one embodiment of the present specification, R4 is an alkyl group substituted with a hydroxyl group.

In one embodiment of the present specification, R4 is a methyl group substituted with a hydroxyl group.

In one embodiment of the present specification, R4 is an alkyl group substituted with a carboxyl group.

In one embodiment of the present specification, R4 is an alkyl group substituted with an ester group.

In one embodiment of the present specification, R4 is an alkyl group substituted with a phenyl group.

In one embodiment of the present specification, R4 is a methyl group substituted with a phenyl group.

In one embodiment of the present specification, R4 and R5 or R6 form a fused substituted or unsubstituted cycloalkyl ring.

In one embodiment of the present specification, R4 and R5 or R6 form a fused cyclohexyl ring.

In one embodiment of the present specification, R1 or R2 and R5 or R6 form a fused cyclic alkyl ring with each other.

In one embodiment of the present specification, R3 and R4 form a fused substituted or unsubstituted cyclic alkyl ring.

In one embodiment of the present specification, R3 and R4 form a fused substituted or unsubstituted cyclic ketone ring.

In one embodiment of the present specification, R3 and R4 form a fused substituted or unsubstituted heterocyclic ketone ring.

In one embodiment of the present specification, R3 and R4 form a fused substituted or unsubstituted aromatic ring.

In one embodiment of the present specification, the structure within the parenthesis in Chemical Formula 1 is represented by any one of the following chemical Formulae.

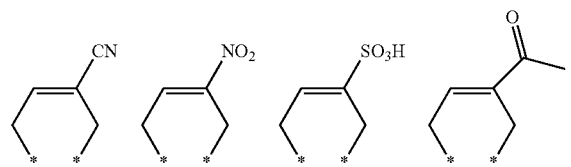

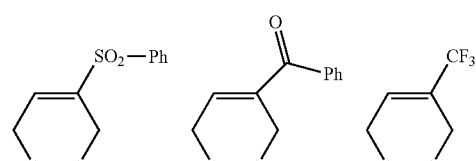

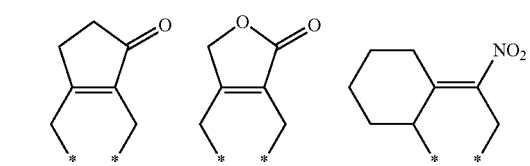

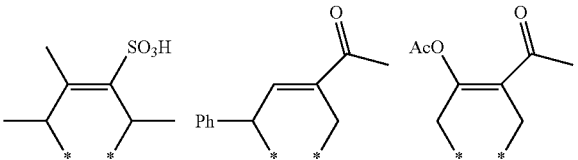

In one embodiment of the present specification, the structure within the parenthesis in Chemical Formula 1 is represented by any one of the following chemical Formulae.

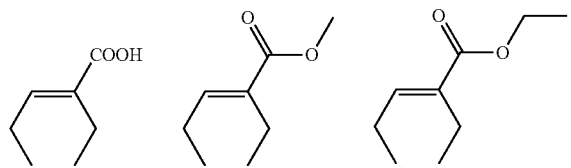

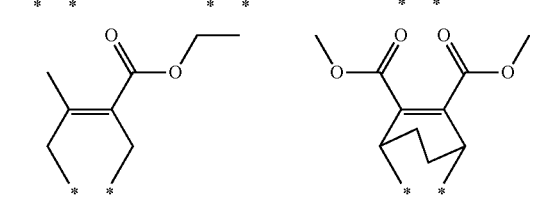

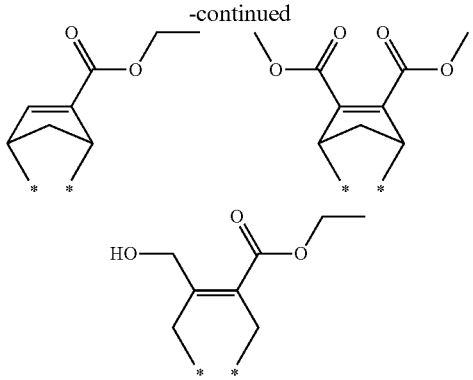

In the chemical formulae, * represents a site bonding to a carbon atom forming a fullerene skeleton of the fullerene derivative, and Me represents a methyl group, Et represents an ethyl group, Bu represents a butyl group, Ph represents a phenyl group, and Ac represents an acetyl group.

In one embodiment of the present specification, the fullerene derivative represented by Chemical Formula 1 provides a fullerene derivative represented by any one of the following chemical Formulae 1-1-1 to 1-1-9, 1-1-11 to 1-1-13 and 1-2-1.

[Chemical Formula 1-1-1]

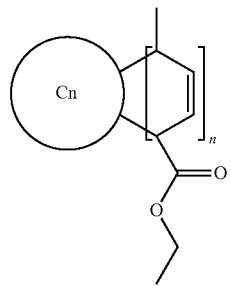

[Chemical Formula 1-1-2]

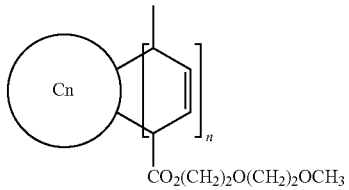

[Chemical Formula 1-1-3]

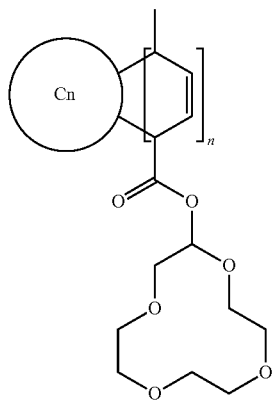

[Chemical Formula 1-1-4]
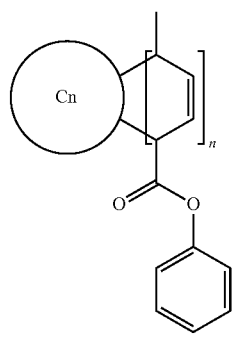
[Chemical Formula 1-1-5]
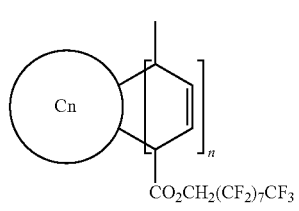
[Chemical Formula 1-1-6]
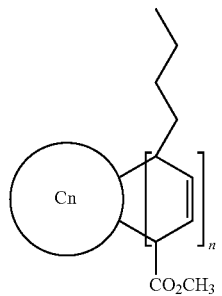
[Chemical Formula 1-1-7]
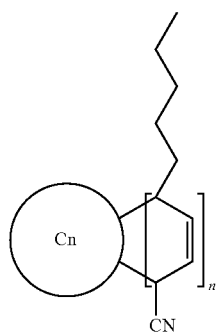
[Chemical Formula 1-1-8]
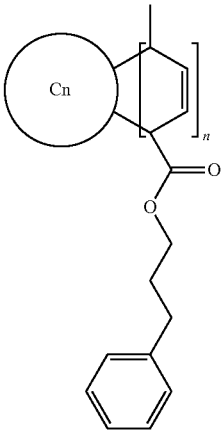
[Chemical Formula 1-1-9]
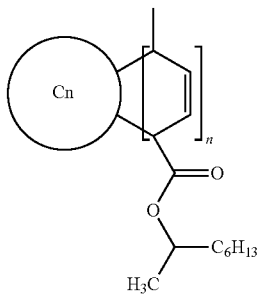
[Chemical Formula 1-1-11]
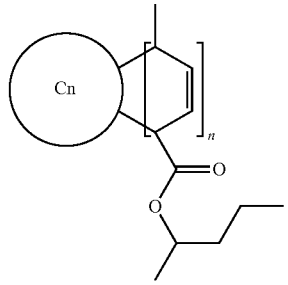
[Chemical Formula 1-1-12]
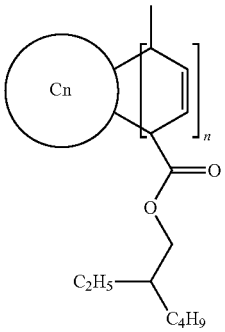
[Chemical Formula 1-1-13]
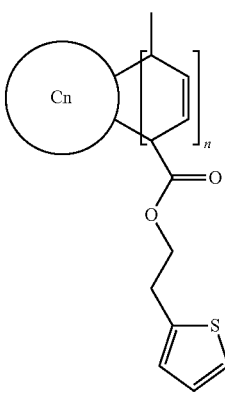
[Chemical Formula 1-2-1]
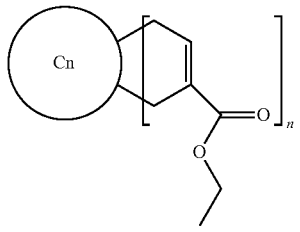

-continued

[Chemical Formula 1-1-3]

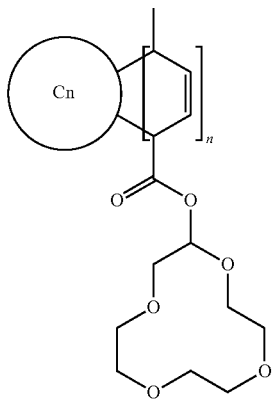

In Chemical Formulae 1-1-1 to 1-1-9, 1-1-11 to 1-1-13 and 1-2-1, n and Cn are the same as defined above.

The fullerene derivative according to one embodiment of the present specification may further include other structures in addition to the structure within the parenthesis in Chemical Formula 1.

In one embodiment of the present specification, the fullerene skeleton of the fullerene derivative may be used either alone, or two types or more may be used together in any combination and ratio.

In one embodiment of the present specification, the fullerene derivative represented by Chemical Formula 1 may be prepared by the reaction of a 1,3-diene compound derivative.

In one embodiment of the present specification, the fullerene derivative represented by Chemical Formula 1 may be prepared by reacting a material having a fullerene skeleton with sorbic acid ester. Specifically, the fullerene derivative represented by Chemical Formula 1 may be prepared using an addition reaction by mixing and heating a material having a fullerene skeleton with sorbic acid ester.

Specifically, the addition reaction may be carried out by mixing the above materials in each solvent or solvent free, and heating.

As the solvent, one, two or more solvents may be mixed and used selecting from aliphatic hydrocarbons such as hexane and heptane; aromatic hydrocarbons such as toluene, xylene, trimethylbenzene and methylnaphthalene; ethers such as dibutyl ether, diethylene glycol diethyl ether, diethylene glycol dimethyl ether and tetrahydrofuran; ketones such as acetone and 2-butanone; alcohols such as methanol, ethanol, 2-propanol, t-butyl alcohol, methoxyethanol and diethylene glycol monomethyl ether; esters such as ethyl acetate; nitriles such as acetonitrile; amides such as N,N-dimethylacetamide; halogenated hydrocarbons such as o-dichlorobenzene, methylene chloride and 1,2-dichloroethane; amines such as pyridine and quinoline; and water.

In one embodiment of the present specification, the organic electronic device is selected from the group consisting of an organic light emitting device; an organic solar cell; and an organic transistor.

In one embodiment of the present specification, the organic electronic device may be an organic light emitting device.

One embodiment of the present invention provides an organic electronic device as an organic light emitting device including a first electrode, a second electrode, and one or more organic material layers disposed between the first electrode and the second electrode, wherein one or more layers of the organic material layers include the fullerene derivative.

In one embodiment of the present specification, the organic material layer includes a light emitting layer, and the light emitting layer includes the fullerene derivative.

In one embodiment of the present specification, the organic material layer includes a hole injection layer or a hole transfer layer, and the hole injection layer or the hole transfer layer includes the fullerene derivative.

In another embodiment of the present specification, the organic material layer includes an electron injection layer or an electron transfer layer, and the electron injection layer or the electron transfer layer includes the fullerene derivative.

In one embodiment of the present specification, the organic electronic device may be an organic transistor.

One embodiment of the present specification provides an organic electronic device as an organic transistor including a source, a drain, a gate and one or more organic material layers, wherein one or more layers of the organic material layers include the fullerene derivative.

In one embodiment of the present specification, the organic electronic device may be an organic solar cell.

The principle of an organic solar cell is that a p-type semiconductor forms excitons paired with holes and electrons by light excitation, and the excitons are separated into electrons and holes at a p-n junction. The separated electrons and holes are transferred to an n-type semiconductor thin film and a p-type semiconductor thin film, respectively, and are collected in a first electrode and a second electrode, respectively, and as a result, the organic solar cell may be used as an electric energy externally.

FIG. 1 illustrates an organic solar cell according to one embodiment of the present specification. In FIG. 1, the organic solar cell includes a substrate (101), a first electrode (102), a hole transfer layer (103), a photoactive layer (104) and a second electrode (105).

In one embodiment of the present specification, the organic material layer includes a photoactive layer and an organic material layer provided between the photoactive layer and the first electrode or the second electrode, and the organic material layer provided between the photoactive layer and the first electrode or the second electrode includes the fullerene derivative.

In one embodiment of the present specification, the organic material layer includes a photoactive layer, the photoactive layer has a bilayer structure including an n-type organic material layer and a p-type organic material layer, and the n-type organic material layer includes the fullerene derivative.

In one embodiment of the present specification, the organic material layer includes a photoactive layer, the photoactive layer includes an electron donor material and an electron acceptor material, and the electron acceptor material includes the fullerene derivative.

In one embodiment of the present specification, the electron donor material and the electron acceptor material in the organic solar cell form a bulk heterojunction (BHJ).

A Bulk heterojunction means an electron donor material and an electron acceptor material being mixed together in a photoactive layer.

In one embodiment of the present specification, the organic compound included in the electron acceptor material is one, two or more compounds selected from the group consisting of fullerene, a fullerene derivative ((6,6)-phenyl-C61-butyric acid-methylester (PCBM) or (6,6)-phenyl-C61- butyric acid-cholesteryl ester (PCBCR), perylene, polybenzimidazole (PBI) and 3,4,9,10-perylene-tetracarboxylic bisbenzimidazole (PTCBI).

In one embodiment of the present specification, the electron acceptor material includes the fullerene derivative that is not heat-cured or UV-cured.

The fullerene derivative according to one embodiment of the present specification may be used as it is without heat curing or UV curing.

The electron acceptor material including the fullerene derivative represented by Chemical Formula 1 according to one embodiment of the present specification may be applied to a photoactive layer as it is without heat curing or UV curing. Therefore, the process has advantages in terms of time and/or costs.

In one embodiment of the present specification, the electron acceptor material includes the fullerene derivative that is heat-cured or UV-cured as necessary.

In one embodiment of the present specification, the n-type organic material layer and/or the electron donor material are preferably compatible with a light absorption wavelength range or a spectrum within sunlight, preferably has a strong light absorbancy, and has excellent electric properties such as charge mobility.

In one embodiment of the present specification, the electron donor material includes an organic compound, and the organic compound is an organic compound capable of being used in a solution process.

In one embodiment of the present specification, the n-type organic material layer and/or the electron donor material include an organic compound, and the organic compound includes a polymer compound or a unimolecular compound.

Specifically, the electron donor material includes the following structures including poly(phenylene vinylene) (PPV)-based polymers or poly(3-hexylthiophene) (P3HT)-based polymers.

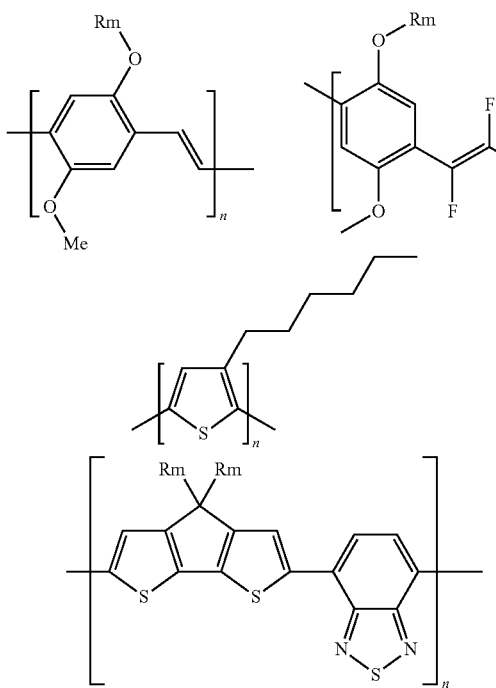

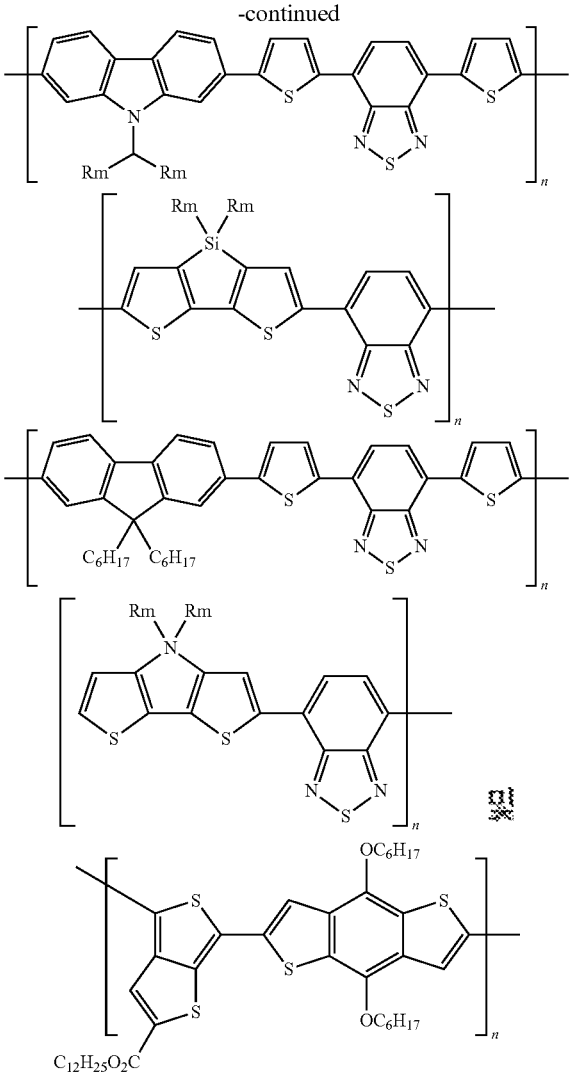

n is an integer of 1 to 1,000,

Rm is hydrogen; a substituted or unsubstituted alkyl group; a substituted or unsubstituted cycloalkyl group; a substituted or unsubstituted alkoxy group; a substituted or unsubstituted alkenyl group; a substituted or unsubstituted aromatic or aliphatic heteroring group including one or more of N, O and S atoms; or a substituted or unsubstituted aryl group.

The electron donor materials are preferably materials having a small band gap so as to absorb all visible ray regions within sunlight, and are generally polymer compounds, but are not limited thereto.

The electron donor material and the electron acceptor material are mixed in a ratio of 1:100 to 100:1 (w/w). After the electron donor material and the electron acceptor material are mixed, the result may be annealed for 1 second to 24 hours at 30 to 300° C. in order to maximize the properties.

In one embodiment of the present specification, the thickness of the photoactive layer ranges from 10 nm to 10,000 nm.

In one embodiment of the present specification, the organic material layer includes a photoactive layer; and an organic material layer provided between the photoactive layer and the first electrode or the second electrode, and the organic material layer provided between the photoactive layer and the first electrode or the second electrode includes the fullerene derivative.

In one embodiment of the present specification, in the organic material layers, the organic material layer provided between the photoactive layer and the first electrode or the second electrode includes the fullerene derivative, and the fullerene derivative is an electron transfer material.

In one embodiment of the present specification, in the organic material layers, the organic material layer provided between the photoactive layer and the first electrode or the second electrode includes a metal oxide, an organic material layer is provided between the metal oxide layer and the photoactive layer, and the organic material layer includes the fullerene derivative.

In one embodiment of the present specification, the organic material layer including the fullerene derivative is in contact with the metal oxide layer.

In one embodiment of the present specification, the organic material layer provided between the photoactive layer and the first electrode or the second electrode includes the fullerene derivative, and the fullerene derivative is an electron injection material.

In one embodiment of the present specification, the organic electronic device has a normal structure.

In one embodiment of the present specification, the organic electronic device has an inverted structure.

In one embodiment of the present specification, the organic electronic device has a normal structure, and the organic material layer includes a photoactive layer; and an organic material layer provided between the photoactive layer and the first electrode, wherein the organic material layer provided between the photoactive layer and the first electrode includes the fullerene derivative, and the first electrode is an anode electrode and the second electrode is a cathode electrode.

In this case, among the fullerene derivatives, an ester group substituted with an alkyl group unsubstituted or substituted with substituents selected from the group consisting of a halogen group, an alkoxy group, a polyethylene glycol group and a crown ether group is favorable.

Specifically, an ester compound having substituents such as an alkyl group including a fluorine (F) group, an ethoxyalkyl group, a polyethylene glycoxyalkyl group or a crown ether alkyl group is favorable. When these compounds form a photoactive layer, the substituent of the fullerene derivative may act as a buffer layer between the photoactive layer and the anode electrode as the substituent of the fullerene derivative is arranged toward the anode following the surface energy of the fullerene derivative. In other words, according to one embodiment of the present specification, the fullerene derivative may simultaneously or each independently act as an electron acceptor and/or a buffer layer.

In one embodiment of the present specification, the organic electronic device has an inverted structure, and the organic material layer includes an organic material layer provided between the photoactive layer and the first electrode, wherein the organic material layer provided between the photoactive layer and the first electrode includes the fullerene derivative, and the first electrode is an anode electrode and the second electrode is a cathode electrode.

In this case, at least one of R1 to R6 is favorably a carboxyl group.

Specifically, R7 is favorably hydrogen, or a compound including a carboxyl (COOH) group among the substituents of the fullerene derivative. The carboxyl group included in the fullerene derivative forms a hydrogen bond with an oxidized metal, and therefore, the fullerene derivative in the photoactive layer has an excellent ability to receive and transfer electrons to the electrode. Consequently, the current value and/or efficiency may be enhanced.

In one embodiment of the present specification, the first electrode may be an anode electrode or a cathode electrode. In addition, the second electrode may be a cathode electrode or an anode electrode.

In one embodiment of the present specification, the organic solar cell may be arranged in order of an anode electrode, a photoactive layer and a cathode electrode.

In another embodiment, the organic solar cell may also be arranged in order of a cathode electrode, a photoactive layer and an anode electrode, but the arrangement is not limited thereto.

In another embodiment, the organic solar cell may be arranged in order of an anode electrode, a hole transfer layer, a photoactive layer, an electron transfer layer and a cathode electrode, or arranged in order of a cathode electrode, an electron transfer layer, a photoactive layer, a hole transfer layer and an anode electrode, however, the arrangement is not limited thereto.

In another embodiment, the organic solar cell may also be arranged in order of an anode electrode, a buffer layer, a photoactive layer and a cathode electrode.

The organic solar cell of the present specification may be prepared using materials and methods known in the art except that the fullerene derivative represented by Chemical Formula 1 is included in one or more layers of the organic material layers of the organic solar cell.

In one embodiment of the present specification, a method for fabricating an organic solar cell, which includes the steps of preparing a substrate; forming a first electrode on top of the substrate; forming one or more organic material layers including a photoactive layer on top of the first electrode; and forming a second electrode on top of the organic material layers, wherein one or more layers of the organic material layers include the fullerene derivative.

The fullerene derivative may be included in the hole transfer layer; the photoactive layer; and/or the electron transfer layer.

For example, the organic solar cell according to the present invention may be fabricated by forming an anode by depositing a metal, a metal oxide having conductivity, or alloys thereof on a substrate using a physical vapor deposition (PVD) method such as sputtering or e-beam evaporation, forming an organic material layer thereon using a vacuum deposition or solution coating method, and then depositing a material that can be used as a cathode thereon.

Each organic material layer described above may be prepared using a solvent process instead of a deposition method using various unimolecular or polymer materials, and examples of the solvent process include roll to roll, spin coating, dip coating, casting, roll court, flow coating, doctor blading, screen printing, ink jet printing, gravure printing, offset printing, spray coating, a thermal printing method or the like.

Each organic material layer described above may be prepared using a method including dry film-forming methods such as vacuum deposition, sputtering, plasma and ion plating.

In one embodiment of the present specification, the method may include the steps of depositing an anode, laminating a photoactive layer, arraying the photoactive layer, heat treating the photoactive layer and depositing a cathode.

In the step of laminating the photoactive layer, the photoactive layer may be disposed in a composite thin film structure in which a solution mixed with an electron donor material and an electron acceptor material is sprayed and deposited on the upper side of both electrodes, that is, in a bulk heterojunction.

As the electron acceptor material, a mixed solution in which a composite polymer material is dissolved in an organic solvent may be used, and the electron acceptor material may include the fullerene derivative.

In one embodiment of the present specification, P3HT and the fullerene derivative are used by being dissolved in an organic solvent.

The substrate in the present specification may include a glass substrate or a transparent plastic substrate, which has excellent transparency, surface smoothness, handling easiness and water resistance, but is not limited thereto, and substrates typically used for organic solar cells may be used without limit. Specific examples thereof include glass, polyethylene terphthalate (PET), polyethylene naphthalate (PEN), polypropylene (PP), polyimide (PI), triacetyl cellulose (TAC) and the like, but are not limited thereto.

The anode electrode may include a material that is transparent and has excellent conductivity, but the material is not limited thereto. Examples of the anode material include metals such as vanadium, chromium, copper, zinc or gold, or alloys thereof; metal oxides such as zinc oxides, indium oxides, indium tin oxides (ITO) or indium zinc oxides (IZO); and a combination of metals and oxides such as $ZnO:Al$ or $SnO_2:Sb$; conductive polymers such as poly(3-methylthiophene), poly[3,4-(ethylene-1,2-dioxy)thiophene] (PEDOT), polypyrrole and polyaniline, and the like, but are not limited thereto.

The method of forming the anode electrode is not particularly limited, however, the anode electrode may be formed by being applied to one surface of the substrate or coated in the form of a film using a method such as sputtering, E-bean, thermal deposition, spin coating, screen printing, ink jet printing, doctor blade or gravure printing.

When the anode electrode is formed on a substrate, the result may go through processes of cleaning, dehydrating and modifying to be hydrophilic.

For example, after the patterned ITO substrate is cleaned with a cleaning agent, acetone and isopropyl alcohol (IPA) in consecutive order, the ITO substrate is dried for 1 to 30 minutes at 100 to 150° C. and preferably for 10 minutes at 120° C. on a heating plate in order to remove moisture, and when the substrate is completely cleaned, the surface of the substrate is modified to be hydrophilic.

Through the surface modification described above, the junctional surface potential may be maintained at a level suitable for the surface potential of the photoactive layer. In addition, when the surface is modified, a polymer thin film may be readily formed on the anode electrode, and the quality of the thin film may be improved.

Preprocessing technologies for the anode electrode include a) a surface oxidation method using parallel plate discharge, b) a method of oxidizing the surface through the ozone generated by UV rays in a vacuum, and c) an oxidation method using the oxygen radicals generated by plasma.

One of the methods described above may be selected depending on the condition of an anode electrode or a substrate. However, it is commonly preferable to prevent the leave of the oxygen of the anode electrode or the surface of the substrate and to suppress the remaining of moisture and organic materials as much as possible, no matter which method is used. In this case, practical effects of the preprocessing can be maximized.

As a specific example, a method of oxidizing the surface through the ozone generated by UV rays may be used. Herein, the patterned ITO substrate may be fully dried by baking the patterned ITO substrate on a hot plate after being ultrasonic cleaned, and the patterned ITO substrate may be introduced into a chamber and then cleaned by the ozone generated by reacting the oxygen gas with UV light using a UV lamp.

However, the method of surface modification of the patterned ITO substrate in the present specification is not particularly limited, and any method oxidizing a substrate may be used.

The cathode electrode may include a metal having small work function, but is not limited thereto. Specific examples thereof include metals such as magnesium, calcium, sodium, potassium, titanium, indium, yttrium, lithium, gadolinium, aluminum, silver, tin and lead, or alloys thereof; or multi-layer structure materials such as LiF/Al, $LiO_2$/Al, LiF/Fe, Al:Li, Al:$BaF_2$ and Al:$BaF_2$:Ba, but are not limited thereto.

The cathode electrode may be formed by being deposited inside a thermal depositor having a vacuum degree of $5 \times 10^{-7}$ torr or less, but the formation is not limited to this method.

The hole transfer layer and/or the electron transfer layer material play the role of efficiently transferring the electrons and the holes separated in a photoactive layer to an electrode, and the material is not particularly limited.

The hole transfer layer material may include PEDOT:PSS (Poly(3,4-ethylenediocythiophene) doped with poly(styrenesulfonic acid)), molybdenum oxides ($MoO_x$); vanadium oxides ($V_2O_5$); nickel oxides (NiO); tungsten oxides ($WO_x$), and the like, but is not limited thereto.

The electron transfer layer material may include electron-extracting metal oxides, and may specifically include a metal complex of 8-hydroxyquinoline; a complex including $Alq_3$; a metal complex including Liq; LiF; Ca; titanium oxides ($TiO_x$); zinc oxides (ZnO); cesium carbonate ($Cs_2CO_3$), and the like, but is not limited thereto.

The photoactive layer may be formed by dissolving a photoactive material such as an electron donor and/or an electron acceptor in an organic solvent, and then applying the solution using a method such as spin coating, dip coating, screen printing, spray coating, doctor blade and brush painting, but the method is not limited thereto.

Hereinafter, a method for preparing the fullerene derivative and a method for fabricating an organic solar cell using the fullerene derivative will be described in detail with reference to preparation examples and examples. However, the following examples are for illustrative purposes only, and the scope of the present specification is not limited thereto.

[Preparation Example 1-1-1] Synthesis of Fullerene Derivative 1-1-1

[Chemical Formula 1-1-1]

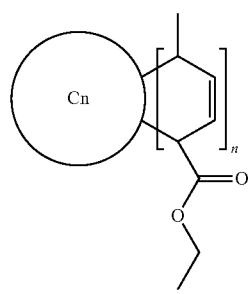

After 80 ml of 1,2-dichlorobenzene was added to $C_{60}$ (5.0 g, 6.9 mmol) and ethyl sorbate (20.0 g, 143 mmol), the mixture was heated and stirred for 40 hours at 110° C. under nitrogen atmosphere. Excess ethyl sorbate was removed by vacuum distillation, and then solubles were extracted using tetrahydrofuran. After the extract was vacuum concentrated, the obtained solids were washed with methanol and dried to give 4.0 g of a fullerene derivative represented by Chemical Formula 1-1-1 as dark brown solids. The product prepared as above has various mixture forms of n being 2 or greater, and the cell was fabricated without further purifying this product.

[Preparation Example 1-1-2] Synthesis of Fullerene Derivative 1-1-2

[Chemical Formula 1-1-2]

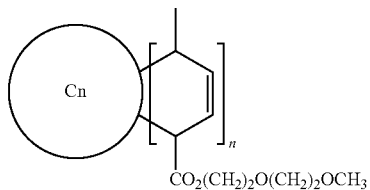

$CO_2(CH_2)_2O(CH_2)_2OCH_3$

A fullerene derivative represented by Chemical Formula 1-1-2 was obtained as dark brown solids in the same manner as in Preparation Example 1-1-1 except that (2-methoxy-ethoxy)ethylhexa-2,4-dienoate was used instead of ethyl sorbate in Preparation Example 1-1-1. The product prepared as above has various mixture forms of n being 2 or greater, and the cell was fabricated without further purifying this product.

[Preparation Example 1-1-3] Synthesis of Fullerene Derivative 1-1-3

[Chemical Formula 1-1-3]

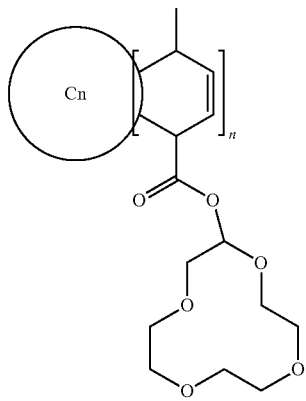

A fullerene derivative represented by Chemical Formula 1-1-3 was obtained as dark brown solids in the same manner as in Preparation Example 1-1-1 except that tetraoxacy-clododecan-2-yl-hexa-2,4-dienoate was used instead of ethyl sorbate in Preparation Example 1-1-1. The product prepared as above has various mixture forms of n being 2 or greater, and the cell was fabricated without further purifying this product.

[Preparation Example 1-1-4] Synthesis of Fullerene Derivative 1-1-4

[Chemical Formula 1-1-4]

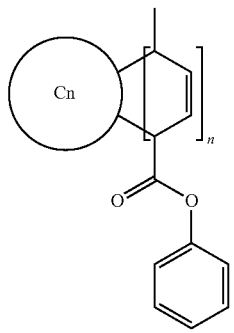

A fullerene derivative represented by Chemical Formula 1-1-4 was obtained as dark brown solids in the same manner as in Preparation Example 1-1-1 except that phenyl-hexa-2,4-dienoate was used instead of ethyl sorbate in Preparation Example 1-1-1. The product prepared as above has various mixture forms of n being 2 or greater, and the cell was fabricated without further purifying this product.

[Preparation Example 1-1-5] Synthesis of Fullerene Derivative 1-1-5

[Chemical Formula 1-1-5]

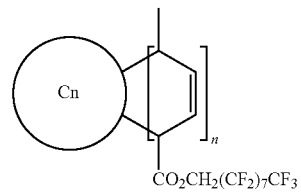

$CO_2CH_2(CF_2)_7CF_3$

A fullerene derivative represented by Chemical Formula 1-1-5 was obtained as dark brown solids in the same manner as in Preparation Example 1-1-1 except that heptadeca-fluoro-nonanyl-hexa-2,4-dienoate was used instead of ethyl sorbate in Preparation Example 1-1-1. The product prepared as above has various mixture forms of n being 2 or greater, and the cell was fabricated without further purifying this product.

[Preparation Example 1-1-6] Synthesis of Fullerene Derivative 1-1-6

[Chemical Formula 1-1-6]

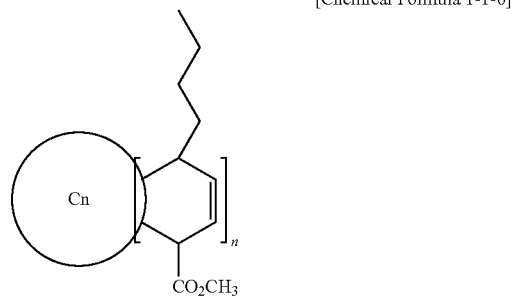

$CO_2CH_3$

A fullerene derivative represented by Chemical Formula 1-1-6 was obtained as dark brown solids in the same manner as in Preparation Example 1-1-1 except that methyl nona-2,4-pentadienoate was used instead of ethyl sorbate in Preparation EXAMPLE 1-1-1. The product prepared as above has various mixture forms of n being 2 or greater, and the cell was fabricated without further purifying this product.

[Preparation Example 1-1-7] Synthesis of Fullerene Derivative 1-1-7

[Chemical Formula 1-1-7]

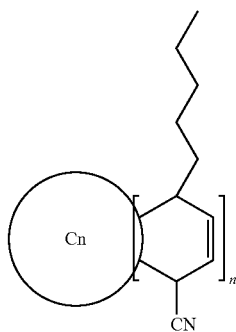

A fullerene derivative represented by Chemical Formula 1-1-7 was obtained as dark brown solids in the same manner as in Preparation Example 1-1-1 except that deca-2,4-dienenitrile was used instead of ethyl sorbate in Preparation Example 1-1-1. The product prepared as above has various mixture forms of n being 2 or greater, and the cell was fabricated without further purifying this product.

[Preparation Example 1-1-8] Synthesis of Fullerene Derivative 1-1-8

[Chemical Formula 1-1-8]

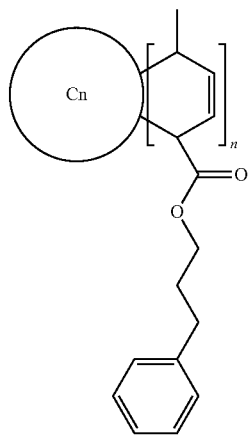

After 80 ml of 1,2-dichlorobenzene was added to $C_{60}$ (7.0 g, 9.7 mmol) and 3-phenylpropyl (2E,4E)-hexa-2,4-dienoate (2.24 g, 9.72 mmol), the mixture was heated and stirred for 40 hours at 110° C. under nitrogen atmosphere. Excess 1,2-dichlorobenzene was removed by vacuum distillation, and then solubles were extracted using tetrahydrofuran. After the extract was vacuum concentrated, the result was column purified by being developed with toluene, and then recrystallized with toluene and n-hexane to prepare a compound of Chemical Formula 1-1-8. Herein, n is 1.

FIG. 4 is a diagram showing liquid chromatography (HPLC) in the structure of Chemical Formula 1-1-8 according to one embodiment of the present specification.

[Preparation Example 1-1-9] Synthesis of Fullerene Derivative 1-1-9

[Chemical Formula 1-1-9]

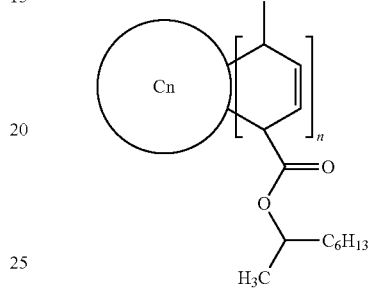

After 80 ml of 1,2-dichlorobenzene was added to $C_{60}$ (5.0 g, 6.94 mmol) and 2-octyl sorbate (1.46 g, 6.51 mmol), the mixture was heated and stirred for 40 hours at 110° C. under nitrogen atmosphere. Excess 1,2-dichlorobenzene was removed by vacuum distillation, and then solubles were extracted using tetrahydrofuran. After the extract was vacuum concentrated, the result was column purified by being developed with toluene, and then recrystallized with toluene and n-hexane to prepare a compound of Chemical Formula 1-1-9. Herein, n is 1.

FIG. 5 is a diagram showing liquid chromatography (HPLC) in the structure of Chemical Formula 1-1-9 according to one embodiment of the present specification.

[Preparation Example 1-1-10] Synthesis of Fullerene Derivative 1-1-10

[Chemical Formula 1-1-10]

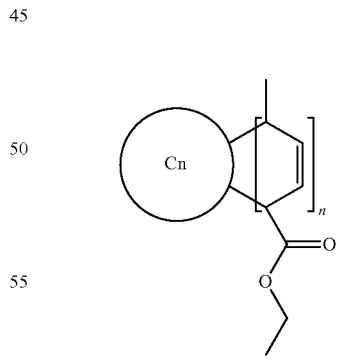

After 80 ml of 1,2-dichlorobenzene was added to $C_{60}$ (5.0 g, 6.9 mmol) and ethyl sorbate (0.96 g, 6.9 mmol), the mixture was heated and stirred for 40 hours at 110° C. under nitrogen atmosphere. Excess 1,2-dichlorobenzene was removed by vacuum distillation, and then solubles were extracted using tetrahydrofuran. After the extract was vacuum concentrated, the result was column purified by being developed with toluene, and then recrystallized with toluene and n-hexane to prepare a compound of Chemical Formula 1-1-10. Herein, n is 1.

FIG. 2 is $^1$H-NMR (in $C_6D_4Cl_2$) of the compound of n=1 in the structure of Chemical Formula 1-1-10 according to one embodiment of the present specification.

FIG. 3 is a diagram showing liquid chromatography (HPLC) of the compound of n=1 in the structure of Chemical Formula 1-1-10 according to one embodiment of the present specification.

[Preparation Example 1-1-11] Synthesis of Fullerene Derivative 1-1-11

[Chemical Formula 1-1-11]

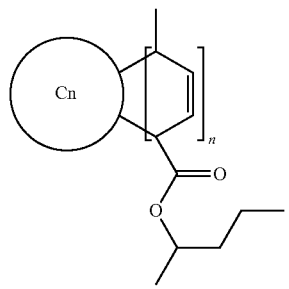

After 80 ml of 1,2-dichlorobenzene was added to $C_{60}$ (3.5 g, 4.86 mmol) and 2-pentyl sorbate (0.82 g, 4.49 mmol), the mixture was heated and stirred for 40 hours at 110° C. under nitrogen atmosphere. Excess 1,2-dichlorobenzene was removed by vacuum distillation, and then solubles were extracted using tetrahydrofuran. After the extract was vacuum concentrated, the result was column purified by being developed with toluene, and then recrystallized with toluene and n-hexane to prepare a compound of Chemical Formula 1-1-11. Herein, n is 1.

FIG. 6 is a diagram showing an NMR graph in the structure of Chemical Formula 1-1-11 according to one embodiment of the present specification.

FIG. 7 is a diagram showing liquid chromatography (HPLC) in the structure of Chemical Formula 1-1-11 according to one embodiment of the present specification.

[Preparation Example 1-1-12] Synthesis of Fullerene Derivative 1-1-12

[Chemical Formula 1-1-12]

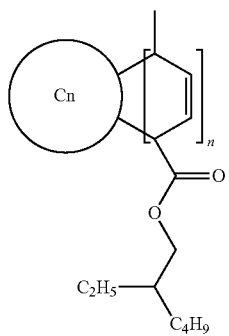

After 80 ml of 1,2-dichlorobenzene was added to $C_{60}$ (5.0 g, 6.94 mmol) and 2-ethylhexyl sorbate (1.46 g, 6.51 mmol), the mixture was heated and stirred for 40 hours at 110° C. under nitrogen atmosphere. Excess 1,2-dichlorobenzene was removed by vacuum distillation, and then solubles were extracted using tetrahydrofuran. After the extract was vacuum concentrated, the result was column purified by being developed with toluene, and then recrystallized with toluene and n-hexane to prepare a compound of Chemical Formula 1-1-12. Herein, n is 1.

[Preparation Example 1-1-13] Synthesis of Fullerene Derivative 1-1-13

[Chemical Formula 1-1-13]

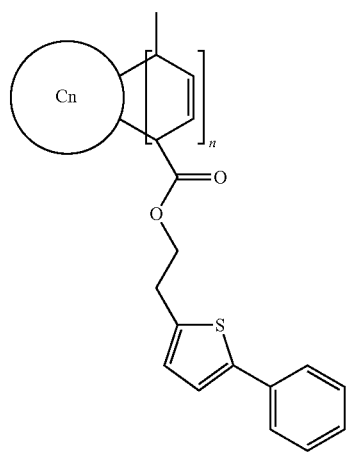

After 80 ml of 1,2-dichlorobenzene was added to $C_{60}$ (5.0 g, 6.94 mmol) and 2-(5-phenylthiophen-2-yl)ethyl (2E,4E)-hexa-2,4-dienoate (1.94 g, 6.51 mmol), the mixture was heated and stirred for 40 hours at 110° C. under nitrogen atmosphere. Excess 1,2-dichlorobenzene was removed by vacuum distillation, and then solubles were extracted using tetrahydrofuran. After the extract was vacuum concentrated, the result was column purified by being developed with toluene, and then recrystallized with toluene and n-hexane to prepare a compound of Chemical Formula 1-1-13. Herein, n is 1.

[Preparation Example 1-2-1] Synthesis of Fullerene Derivative 1-2-1

[Chemical Formula 1-2-1]

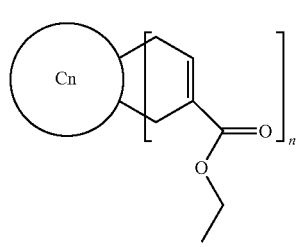

A fullerene derivative represented by Chemical Formula 1-2-1 was obtained as dark brown solids based on the method described in the literature "Tetrahedron, vol. 52, 4983(1996)" except that the raw material fullerene was used in half the molar ratio. The product prepared as above has various mixture forms of n being 2 or greater, and the cell was fabricated without further purifying this product.

Fabrication of Organic Solar Cell and Measurement of its Characteristics

The photoelectric conversion properties of the organic solar cell prepared in Preparation Examples 1-1-1 to 1-1-13 and Preparation Example 1-2-1 were measured under the condition of 100 mW/cm$^2$ (AM 1.5), and the results are shown in the following Table 1.

<Example 1-1> Fabrication of Organic Solar Cell

A composite solution was prepared by dissolving the compound prepared in Preparation Example 1-1-1 and P3HT in the ratio of 1:0.7 in chlorobenzene (CB). Herein, the concentration was adjusted to 2.0 wt %, and the structure of the organic solar cell employed an ITO/PEDOT:PSS/photoactive layer/Al structure. The glass substrate coated with ITO was ultrasonic cleaned using distilled water, acetone and 2-propanol, and after the ITO surface was ozone treated for 10 minutes, the surface was spin-coated with PEDOT:PSS (baytrom P) to a thickness of 45 nm, and then heat treated for 10 minutes at 120° C. In order to coat the photoactive layer, the compound-P3HT composite solution was filtered using a PP syringe filter of 0.45 μm, then spin-coated, and deposited with Al to a thickness of 200 nm using a thermal evaporator under the vacuum of 3×10$^{-8}$ torr, and as a result, the organic solar cell was fabricated.

<Example 1-2> Fabrication of Organic Solar Cell

The organic solar cell was fabricated in the same manner as in Example 1-1, except that the compound of Chemical Formula 1-1-2 prepared in Preparation Example 1-1-2 was used instead of the compound of Chemical Formula 1-1-1, and the ratio of P3HT and the fullerene derivative was 1:1.

<Example 1-3> Fabrication of Organic Solar Cell

The organic solar cell was fabricated in the same manner as in Example 1-1, except that the compound of Chemical Formula 1-1-3 prepared in Preparation Example 1-1-3 was used instead of the compound of Chemical Formula 1-1-1, and the ratio of P3HT and the fullerene derivative was 1:1.

<Example 1-4> Fabrication of Organic Solar Cell

The organic solar cell was fabricated in the same manner as in Example 1-1, except that the compound of Chemical Formula 1-1-4 prepared in Preparation Example 1-1-4 was used instead of the compound of Chemical Formula 1-1-1, and the ratio of P3HT and the fullerene derivative was 1:1.

<Example 1-5> Fabrication of Organic Solar Cell

The organic solar cell was fabricated in the same manner as in Example 1-1, except that the compound of Chemical Formula 1-1-5 prepared in Preparation Example 1-1-5 was used instead of the compound of Chemical Formula 1-1-1.

<Example 1-6> Fabrication of Organic Solar Cell

The organic solar cell was fabricated in the same manner as in Example 1-1, except that the compound of Chemical Formula 1-1-6 prepared in Preparation Example 1-1-6 was used instead of the compound of Chemical Formula 1-1-1, and the ratio of P3HT and the fullerene derivative was 1:1.

<Example 1-7> Fabrication of Organic Solar Cell

The organic solar cell was fabricated in the same manner as in Example 1-1, except that the compound of Chemical Formula 1-1-7 prepared in Preparation Example 1-1-7 was used instead of the compound of Chemical Formula 1-1-1, and the ratio of P3HT and the fullerene derivative was 1:2.

<Example 1-8> Fabrication of Organic Solar Cell

The organic solar cell was fabricated in the same manner as in Example 1-1, except that the compound of Chemical Formula 1-1-5 prepared in Preparation Example 1-1-5 was used instead of the compound of Chemical Formula 1-1-1, and the ratio of P3HT, PCBM and the compound of Chemical Formula 1-1-5 was 1:0.7:0.05.

<Example 1-9> Fabrication of Organic Solar Cell

The organic solar cell was fabricated in the same manner as in Example 1-1, except that the compound of Chemical Formula 1-2-1 prepared in Preparation Example 1-2-1 was used instead of the compound of Chemical Formula 1-1-1, and the ratio of P3HT and the fullerene derivative was 1:1.

<Example 1-10> Fabrication of Organic Solar Cell

The organic solar cell was fabricated in the same manner as in Example 1-1, except that the compound of Chemical Formula 1-1-8 prepared in Preparation Example 1-1-8 was used instead of the compound of Chemical Formula 1-1-1, and the ratio of P3HT and the fullerene derivative was 1:1.

<Example 1-11> Fabrication of Organic Solar Cell

The organic solar cell was fabricated in the same manner as in Example 1-1, except that the compound of Chemical Formula 1-1-9 prepared in Preparation Example 1-1-9 was used instead of the compound of Chemical Formula 1-1-1, and the ratio of P3HT and the fullerene derivative was 1:1.

<Example 1-12> Fabrication of Organic Solar Cell

The organic solar cell was fabricated in the same manner as in Example 1-1, except that the compound of Chemical Formula 1-1-10 prepared in Preparation Example 1-1-10 was used instead of the compound of Chemical Formula 1-1-1, and the ratio of P3HT and the fullerene derivative was 1:1.

<Example 1-13> Fabrication of Organic Solar Cell

The organic solar cell was fabricated in the same manner as in Example 1-1, except that the compound of Chemical Formula 1-1-11 prepared in Preparation Example 1-1-11 was used instead of the compound of Chemical Formula 1-1-1, and the ratio of P3HT and the fullerene derivative was 1:1.

<Example 1-14> Fabrication of Organic Solar Cell

The organic solar cell was fabricated in the same manner as in Example 1-1, except that the compound of Chemical Formula 1-1-12 prepared in Preparation Example 1-1-12 was used instead of the compound of Chemical Formula 1-1-1, and the ratio of P3HT and the fullerene derivative was 1:1.

<Example 1-15> Fabrication of Organic Solar Cell

The organic solar cell was fabricated in the same manner as in Example 1-1, except that the compound of Chemical Formula 1-1-13 prepared in Preparation Example 1-1-13 was used instead of the compound of Chemical Formula 1-1-1, and the ratio of P3HT and the fullerene derivative was 1:1.

<Comparative Example 1-1> Fabrication of Organic Solar Cell

A composite solution was prepared by dissolving P3HT and PCBM in the ratio of 1:0.7 in 1,2-dichlorobenzene (DCB). Herein, the concentration was adjusted to 1.0 to 2.0 wt %, and the organic solar cell employed an ITO/PEDOT: PSS/photoactive layer/LiF/Al structure. The glass substrate coated with ITO was ultrasonic cleaned using distilled water, acetone and 2-propanol, and after the ITO surface was ozone treated for 10 minutes, the surface was spin-coated with PEDOT:PSS (baytrom P) to a thickness of 45 nm, and then heat treated for 10 minutes at 120° C. In order to coat the photoactive layer, the compound-PCBM composite solution was filtered using a PP syringe filter of 0.45 μm, then spin-coated, heat treated for 5 minutes at 120° C., and deposited with LiF to a thickness of 7 Å and then with Al to a thickness of 200 nm using a thermal evaporator under the vacuum of $3 \times 10^{-8}$ torr, and as a result, the organic solar cell was manufactured.

TABLE 1

|  | Active Layer (P3HT:Compound) | $V_{OC}$ (V) | $J_{SC}$ (mA/cm$^2$) | FF | PCE (%) |
|---|---|---|---|---|---|
| Comparative Example 1-1 | P3HT:PC$_{61}$BM = 1:0.7 | 0.65 | 7.71 | 0.59 | 2.91 |
| Example 1-1 | P3HT:Chemical Formula 1-1-1 = 1:0.7 | 0.63 | 8.90 | 0.54 | 3.03 |
| Example 1-2 | P3HT]:Chemical Formula 1-1-2 = 1:1 | 0.60 | 7.41 | 0.62 | 2.76 |
| Example 1-3 | P3HT:Chemical Formula 1-1-3 = 1:1 | 0.63 | 4.46 | 0.37 | 1.04 |
| Example 1-4 | P3HT:Chemical Formula 1-1-4 = 1:1 | 0.69 | 8.20 | 0.30 | 1.70 |
| Example 1-5 | P3HT:Chemical Formula 1-1-5 = 1:0.7 | 0.63 | 7.72 | 0.66 | 3.21 |
| Example 1-6 | P3HT:Chemical Formula 1-1-6 = 1:1 | 0.65 | 7.69 | 0.63 | 3.15 |
| Example 1-7 | P3HT:Chemical Formula 1-1-7 = 1:2 | 0.53 | 10.78 | 0.50 | 2.86 |
| Example 1-8 | P3HT:PC$_{61}$BM:Chemical Formula 1-1-5 = 1:0.7:0.05 | 0.65 | 8.96 | 0.65 | 3.79 |
| Example 1-9 | P3HT:Chemical Formula 1-2-1 = 1:1 | 0.62 | 6.26 | 0.54 | 2.10 |
| Example 1-10 | P3HT:Chemical Formula 1-1-8 = 1:1 | 0.63 | 8.19 | 0.63 | 3.25 |
| Example 1-11 | P3HT:Chemical Formula 1-1-9 = 1:1 | 0.59 | 8.19 | 0.63 | 3.04 |
| Example 1-12 | P3HT:Chemical Formula 1-1-10 = 1:1 | 0.60 | 7.89 | 0.52 | 2.49 |
| Example 1-13 | P3HT:Chemical Formula 1-1-11 = 1:1 | 0.58 | 8.21 | 0.38 | 1.8 |
| Example 1-14 | P3HT:Chemical Formula 1-1-12 = 1:1 | 0.65 | 8.89 | 0.56 | 3.23 |
| Example 1-15 | P3HT:Chemical Formula 1-1-13 = 1:1 | 0.61 | 8.08 | 0.67 | 3.30 |

In the present specification, only P3HT was used as the electron donor material, however, the electron donor material is not limited thereto, and is not limited to polymer compounds or unimolecular compounds as long as it is a compound capable of being used in a solution process.

According to one embodiment of the present specification, the examples are provided for a device with a normal structure only, however, the examples may be provided for a device with an inverted structure as well.

While examples of the present invention have been described above, it will be apparent that the scope of the present invention is not limited thereto since these specific descriptions are provided to instruct the scope of the present invention for those skilled in the art. Therefore, the actual scope of the present invention is defined by the appended claims and their equivalents.

REFERENCE NUMBER

101: substrate
102: First Electrode
103: Hole Transfer Layer
104: Photoactive Layer
105: Second Electrode

The invention claimed is:
1. An organic electronic device comprising:
a first electrode;
a second electrode provided opposite to the first electrode; and
one or more organic material layers provided between the first electrode and the second electrode,
wherein one or more layers of the organic material layers include a fullerene derivative represented by the following Chemical Formula 1:

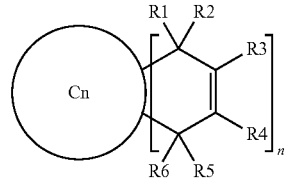

[Chemical Formula 1]

wherein, in Chemical Formula 1,
n is an integer of 1 to 5,
when n is 2 or greater, structures within a parenthesis are the same as or different from each other,
Cn is fullerene of C$_{60}$ to C$_{120}$,
R3 and R4 are hydrogen, and
R1, R2, R5 and R6 are the same as or different from each other, each independently hydrogen; a cyano group; a substituted or unsubstituted alkyl group; or a substituted or unsubstituted ester group.
2. The organic electronic device of claim 1,
wherein at least one of R1, R2, R5 and R6 is

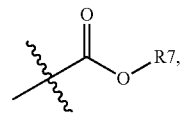

and
wherein R7 is a hydrogen; a substituted or unsubstituted alkyl group having 1 to 60 carbon atoms; a substituted or unsubstituted cycloalkyl group having 3 to 60 carbon atoms; a substituted or unsubstituted arylalkyl group having 7 to 50 carbon atoms; a substituted or unsubstituted heteroarylalkyl group having 2 to 60 carbon atoms; a substituted or unsubstituted carbonyl group having 1 to 40 carbon atoms; a substituted or unsubstituted aryl group having 6 to 60 carbon atoms; or a substituted or unsubstituted heteroring group having 2 to 60 carbon atoms, which includes one or more of N, O and S atoms.

3. The organic electronic device of claim 1, wherein at least one of R1, R2, R5 and R6 is

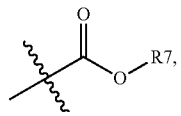

and
wherein R7 is a hydrogen; or an alkyl group unsubstituted or substituted with substituents selected from the group consisting of a halogen group, an alkoxy group, polyethylene glycol, an aryl group, a crown ether group and a heteroring group including one or more of N, O and S atoms; or an aryl group unsubstituted or substituted with substituents selected from the group consisting of an alkyl group, a cyano group, a carbonyl group and an aldehyde group.

4. The organic electronic device of claim 1, wherein the structure within the parenthesis in Chemical Formula 1 is represented by any one of the following chemical Formulae:

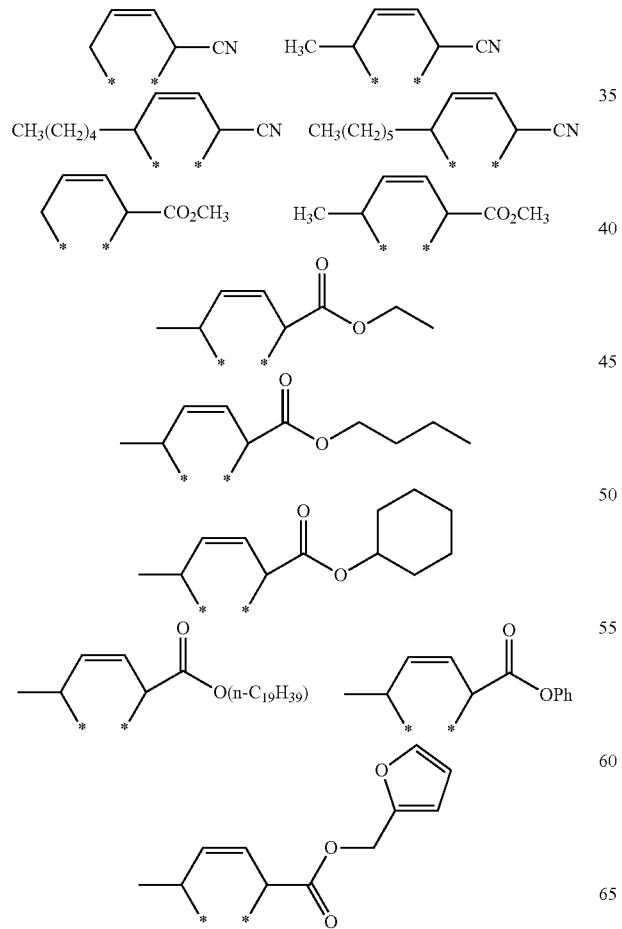

-continued

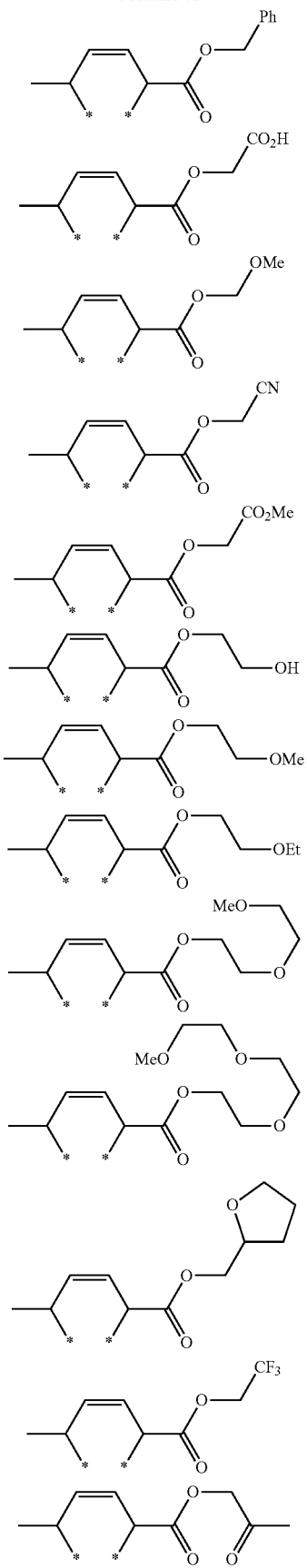

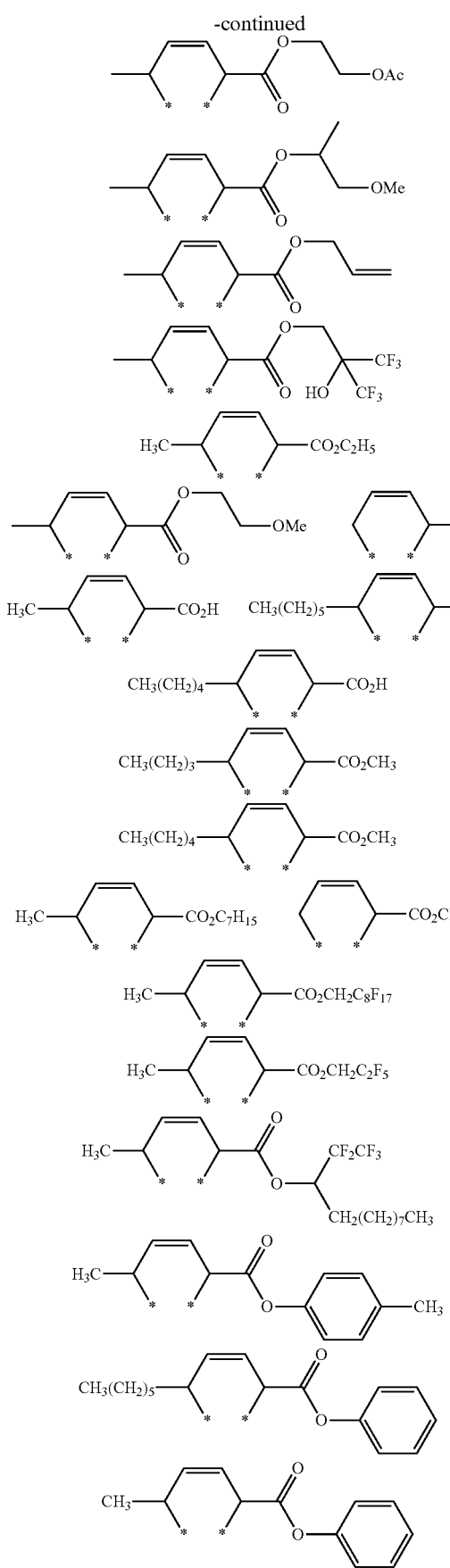
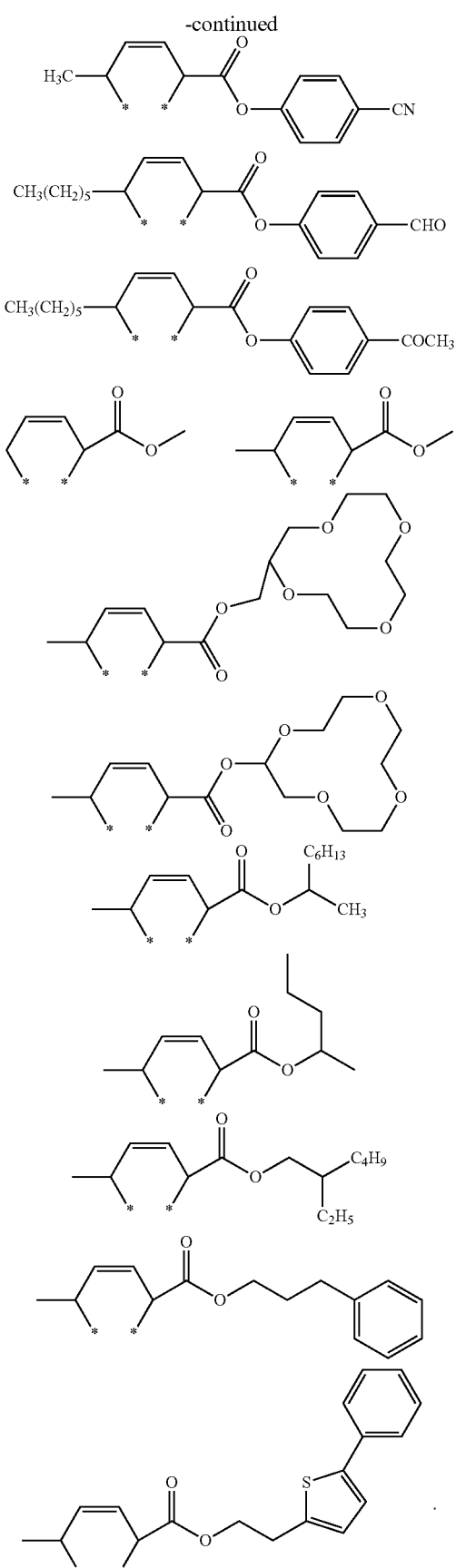

5. The organic electronic device of claim 1, which is selected from the group consisting of an organic light emitting device; an organic solar cell; and an organic transistor.

6. The organic electronic device of claim 1 as an organic solar cell comprising:
a first electrode;
a second electrode provided opposite to the first electrode; and
one or more organic material layers provided between the first electrode and the second electrode,
wherein, one or more layers of the organic material layers include the fullerene derivative.

7. The organic electronic device claim 6, wherein the organic material layer includes a photoactive layer; the photoactive layer has a bilayer structure including an n-type organic material layer and a p-type organic material layer; and the n-type organic material layer includes the fullerene derivative.

8. The organic electronic device claim 6, wherein the organic material layer includes a photoactive layer; the photoactive layer includes an electron donor material and an electron acceptor material; and the electron acceptor material includes the fullerene derivative.

9. The organic electronic device of claim 8, wherein the electron donor material and the electron acceptor material form a bulk heterojunction (BHJ).

10. The organic electronic device of claim 8,
wherein the electron donor material includes an organic compound; and the organic compound is an organic compound capable of being used in a solution process to form the photoactive layer, and
wherein the solution process includes spin coating, dip coating, screen printing, spray coating, doctor blade or brush painting.

11. The organic electronic device of claim 8, wherein the electron donor material includes an organic compound; and the organic compound includes a polymer material or a unimolecular material.

12. The organic electronic device of claim 8, wherein the electron acceptor material includes the fullerene derivative that is not heat-cured or UV-cured.

13. The organic electronic device of claim 8, wherein the electron acceptor material includes the fullerene derivative that is heat-cured or UV-cured.

14. The organic electronic device of claim 6, wherein the organic material layer includes a photoactive layer; and an organic material layer provided between the photoactive layer and the first electrode or the second electrode, wherein one or more layers of the photoactive layer and the organic material layer provided between the photoactive layer and the first electrode or the second electrode include the fullerene derivative.

15. The organic electronic device of claim 14, wherein the organic material layer provided between the photoactive layer and the first electrode or the second electrode includes the fullerene derivative; and the fullerene derivative is an electron transfer material.

16. The organic electronic device of claim 14, wherein the organic material layer provided between the photoactive layer and the first electrode or the second electrode includes a metal oxide layer; and an organic material layer provided between the metal oxide layer and the photoactive layer,
wherein the organic material layer includes the fullerene derivative.

17. The organic electronic device of claim 14, wherein the organic material layer provided between the photoactive layer and the first electrode or the second electrode includes the fullerene derivative; and the fullerene derivative is an electron injection material.

* * * * *